(12) United States Patent
Chung

(10) Patent No.: US 9,275,580 B2
(45) Date of Patent: Mar. 1, 2016

(54) DRIVER AND DISPLAY DEVICE INCLUDING THE SAME

(75) Inventor: Bo-Yong Chung, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 1400 days.

(21) Appl. No.: 13/038,557

(22) Filed: Mar. 2, 2011

(65) Prior Publication Data

US 2012/0081409 A1   Apr. 5, 2012

(30) Foreign Application Priority Data

Sep. 30, 2010   (KR) .................. 10-2010-0095325

(51) Int. Cl.
  *G09G 3/32* (2006.01)
  *G09G 3/36* (2006.01)
  *G11C 19/18* (2006.01)

(52) U.S. Cl.
  CPC ............ *G09G 3/3266* (2013.01); *G09G 3/3677* (2013.01); *G11C 19/184* (2013.01); *G09G 2310/0205* (2013.01)

(58) Field of Classification Search
  CPC .............. G09G 3/3677; G09G 3/3266; G09G 2310/0205
  USPC ........................................... 345/204; 377/64
  See application file for complete search history.

(56) References Cited

U.S. PATENT DOCUMENTS

| 2002/0190326 A1* | 12/2002 | Nagao et al. .................. 257/359 |
| 2005/0116656 A1* | 6/2005 | Shin ........................... 315/169.3 |
| 2006/0202940 A1* | 9/2006 | Azami et al. .................. 345/100 |
| 2010/0315403 A1* | 12/2010 | Kaneyoshi et al. ........... 345/211 |

FOREIGN PATENT DOCUMENTS

| KR | 1020070022550 A | 2/2007 |
| KR | 1020070103182 A | 10/2007 |
| KR | 1020070117924 A | 12/2007 |
| KR | 1020080080713 A | 9/2008 |
| WO | WO 2009104322 A1 * | 8/2009 |

* cited by examiner

*Primary Examiner* — Latanya Bibbins
(74) *Attorney, Agent, or Firm* — Robert E. Bushnell, Esq.

(57) ABSTRACT

The present invention relates to a driver and a display device including the same, wherein the driver includes: a first driving circuit generating a first output signal; a second driving circuit generating a second output signal; and at least one buffer circuit generating a third output signal of a voltage level corresponding to a gate-on voltage level of the first output signal or the second output signal when the first output signal or the second output signal is transmitted as a gate-on voltage level, and the buffer circuit includes a first transistor transmitting the voltage of the first level as the third output signal, and a second transistor transmitting the voltage of a second level turning off the first transistor and connected to the gate electrode of the first transistor.

43 Claims, 10 Drawing Sheets

DRIVER AND DISPLAY DEVICE INCLUDING THE SAME

CLAIM OF PRIORITY

This application makes reference to, incorporates the same herein, and claims all benefits accruing under 35 U.S.C. §119 from an application earlier filed in the Korean Intellectual Property Office on Sep. 30, 2010 and there duly assigned Serial No. 10-2010-0095325.

BACKGROUND OF THE INVENTION

1. Field of the Invention

The present invention relates to a driver and a display device including the same. More particularly, the present invention relates to a driver and a display device including the same that are capable of being applied to a sequential light emitting driving method and a simultaneous light emitting driving method and being operated in a circuit including a thin film transistor having a large leakage current to generate a driving signal and to activate a 3-phase clock signal, thereby configuring a simple interface.

2. Description of the Related Art

Recently, various flat panel displays that are capable of reducing weight and volume that are disadvantages of a cathode ray tube have been developed. As the flat panel displays, there are a liquid crystal display (LCD), a field emission display (FED), a plasma display panel (PDP), an organic light emitting diode (OLED) display, and the like.

Among the flat panel displays, the organic light emitting diode display, which displays images by using an organic light emitting diode (OLED) that generates light by recombining electrons and holes, has a fast response speed, is driven with low power consumption, and has excellent emission efficiency, luminance, and viewing angle, such that it has recently been in the limelight.

In the flat panel display, a plurality of pixels are disposed in a matrix form on a substrate to form a display panel, and scan lines and data lines are connected to the respective pixels to selectively transmit data signals to the pixels and display the signals by controlling light emission by a light emission control signal transmitted through a light emission control line connected to each pixel.

Recently, as display panels have increased in size, screen quality of a sharp, high picture quality has been required, and research and development of a light emission control driver that can be able to control light emission of flat panel displays for providing sharp picture quality and implementing a three-dimensional (3D) video display has been required in line with the trend of 3D stereoscopic image displays taking hold.

Therefore, a driving device applicable to realization of a display of various light emitting methods, improving a yield of a built-in circuit, and simplifying an interface to avoid complexity of the circuit is required.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a driving device that is operable selectively and variously corresponding to a simultaneous or sequential light emitting method of a display device, improving image quality, and improving realization of displaying of 3D stereoscopic images.

The present invention has been made in another effort to develop a circuit of a driving device applicable to a single MOS process of a PMOS transistor or an NMOS transistor, and to provide a driving device operable in a thin film transistor circuit with a large leakage current to improve a yield of a built-in circuit, and a display device including the same.

The present invention has been made in another effort to provide a driving device for freely controlling a duty ratio of a driving signal, be realizable with various timings, and available for overlapping driving.

The technical problems to be achieved by the present invention are not limited to the above-mentioned technical problems, and therefore other technical problems can be clearly understood by those skilled in the art to which the present invention pertains from the following description.

A driver according to an exemplary embodiment of the present invention includes: a first driving circuit generating a first output signal; a second driving circuit generating a second output signal; and at least one buffer circuit generating a third output signal of a voltage level corresponding to a gate-on voltage level of the first output signal or the second output signal when the first output signal or the second output signal is transmitted as a gate-on voltage level.

The buffer circuit includes a first transistor transmitting the voltage of the first level as the third output signal, and a second transistor transmitting the voltage of a second level turning off the first transistor and connected to the gate electrode of the first transistor.

The buffer circuit may further include a third transistor connected to the gate electrode of the first transistor and transmitting the voltage of a third level less than the voltage of the first level turning on the first transistor.

The driver according to another exemplary embodiment of the present invention further includes a third transistor connected to the gate electrode of the first transistor transmitting the voltage of the first level as the third output signal to the buffer circuit and transmitting the voltage of the level less than the voltage of the first level.

The first level in the present invention may be the low level applied in the power source voltage of the low potential, however it is not limited and may be changed according to the type of the circuit configuration.

The buffer circuit includes a shift register including the first driving circuit and the second driving circuit, and a plurality of shift registers may be configured.

Also, the buffer circuit further includes the first transistor connected to the output terminal outputting the third output signal to be turned on and transmitting the voltage of the first level as the third output signal and the fourth transistor connected to the output terminal to be turned on and transmitting the voltage of the second level as the third output signal.

Here, the second level may be the high level applied in the power source voltage of the high potential, however it is not limited and may be changed according to the type of circuit configuration.

A voltage level transmitted by the third transistor is less than the first level by at least twice a threshold voltage of the first transistor.

The third output signal may be output as a voltage of an inverted level when the first output signal is the gate-on voltage level, and is output as a voltage of a corresponding level when the second output signal is the gate-on voltage level. The gate-on voltage level may be the low voltage level.

A voltage level of the output signal is inverted when the first output signal is transmitted as a gate-on voltage level to the buffer circuit, and it is re-inverted when the second output signal is transmitted with the gate-on voltage level to the buffer circuit.

The first driving circuit may receive the first input signal and three phase clock signals, and may output the first output signal controlled according to the first clock signal among the three phase clock signals.

The second driving circuit may receive the second input signal and three phase clock signals, and may output the second output signal controlled according to the second clock signal among the three phase clock signals.

Here, the third output signal may be the scan signal transmitted to the corresponding scan line of the plurality of scan lines or the light emission control signal transmitted to the corresponding light emission control line of the plurality of light emission control lines.

The third output signal may be controlled according to the pulse width or the cycle of the first clock signal controlling the output voltage level of the first output signal in the first driving circuit and the second clock signal controlling the output voltage level of the second output signal in the second driving circuit.

The time that the voltage level of the third output signal is generated and determined may be in synchronization with the time that the first output signal is generated corresponding to the gate-on voltage level pulse of the first clock signal controlling the output voltage level of the first output signal when the first input signal input in the first driving circuit is transmitted as the gate-on voltage level, or may be in synchronization with the time that the second output signal is generated corresponding to the gate-on voltage level pulse of the second clock signal controlling the output voltage level of the second output signal when the second input signal input in the second driving circuit is transmitted as the gate-on voltage level.

The first driving circuit and the second driving circuit may be respectively transmitted with at least three clock signals, and the three clock signals are 3-phase clock signals having a mutual phase difference of ⅓ cycle.

The first driving circuit may include: a first switch controlled by the first signal transmitted through the clock signal terminal and transmitting the voltage according to the voltage level of the first input signal transmitted through the input signal terminal to a first node; a second switch controlled by the first input signal and transmitting the first power source voltage to a second node; a third switch controlled corresponding to the voltage transmitted to the first node and transmitting the voltage according to the voltage level of the second signal transmitted through the clock signal terminal as the voltage level of the first output signal; a fourth switch controlled corresponding to the voltage transmitted to the second node and transmitting the first power source voltage as the voltage level of the first output signal; a first capacitor storing the voltage transmitted to the first node; and a second capacitor storing the voltage transmitted to the second node.

The first driving circuit may further include at least one fifth switch controlled by the second power source voltage lower than the first power source voltage and transmitting the first power source voltage to the first node, and a sixth switch controlled by the third signal input through the clock signal terminal and transmitting the second power source voltage to the fifth switch.

The second driving circuit may further include: a seventh switch controlled by the third signal transmitted through the clock signal terminal and transmitting the voltage according to the voltage level of the second input signal transmitted through the input signal terminal to the third node; an eighth switch controlled by the second input signal and transmitting the first power source voltage to the fourth node; a ninth switch controlled corresponding to the voltage transmitted to the third node and transmitting the voltage according to the voltage level of the first signal transmitted through the clock signal terminal as the voltage level of the second output signal; a tenth switch controlled corresponding to the voltage transmitted to the fourth node and transmitting the first power source voltage as the voltage level of the second output signal; a third capacitor storing the voltage transmitted to the third node; and a fourth capacitor storing the voltage transmitted to the fourth node. However, the present invention is not limited thereto.

The second driving circuit further may include at least one eleventh switch controlled by the second power source voltage lower than the first power source voltage and transmitting the first power source voltage to the third node, and a twelfth switch controlled by the second signal input through the clock signal terminal and transmitting the second power source voltage to the eleventh switch.

The buffer circuit may further include: a thirteenth switch controlled by the first output signal and transmitting the voltage of the second level to the first transistor; a fourteenth switch controlled by the first output signal and transmitting the voltage of the first level to the second transistor and the fifteenth switch; a fifteenth switch controlled by the transmitted voltage of the first level and transmitting the voltage of the second level as the third output signal; a sixteenth switch controlled by the second output signal and transmitting the voltage of the third level less than the voltage of the first level to the first transistor and a seventeenth switch; the seventeenth switch controlled by the voltage of the level less than the voltage of the first level and transmitting the voltage of the second level to the fifteenth switch; a fifth capacitor storing the voltage transmitted to the gate electrode of the first transistor; and a sixth capacitor storing the voltage transmitted to the gate electrode of the fifteenth switch, and the first transistor is operated in response to the voltage of the second level or the third level and outputs the voltage of the first level as the third output signal.

The buffer circuit may further include: a thirteenth switch controlled by the first output signal and transmitting the voltage of the second level to the first transistor; a fourteenth switch controlled by the first output signal and transmitting the voltage of the first level to the second transistor and the fifteenth switch; a fifteenth switch controlled by the transmitted voltage of the first level and transmitting the voltage of the second level as the third output signal; a sixteenth switch controlled by the second output signal and transmitting the voltage of the third level less than the voltage of the first level to the first transistor and the seventeenth switch; a seventeenth switch controlled by the voltage of the level less than the voltage of the first level and transmitting the voltage of the second level to the fifteenth switch; a fifth capacitor storing the voltage transmitted to the gate electrode of the first transistor; and a sixth capacitor storing the voltage transmitted to the gate electrode of the fifteenth switch. The first transistor is operated in response to the voltage of the second level or the third level and outputs the voltage of the first level as the third output signal, and the third transistor is operated by the second output signal and transmits the voltage less than the voltage of the first level to the first transistor and the seventeenth switch.

The first output signal is transmitted as the first input signal of the first driving circuit of the next stage, and the second output signal is transmitted as the second input signal of the second driving circuit of the next stage.

The buffer circuit may further include a first driving switch transmitting the voltage of the second level to the gate electrode of the first transistor when being turned on in response to the first control signal, and a second driving switch transmitting the voltage of the first level to the gate electrode of the second transistor when being turned on in response to the first control signal.

The first driving switch and the second driving switch are turned on, and the buffer circuit generates the voltage of the second level as the third output signal during the period the first control signal is transmitted as the gate-on voltage level.

The buffer circuit further includes: a first driving switch transmitting the voltage of the second level to the gate electrode of the first transistor when being turned on in response to the first control signal; a second driving switch transmitting the voltage of the first level to the gate electrode of the second transistor when being turned on in response to the first control signal, a third driving switch transmitting the voltage of the second level to the gate electrode of the second transistor when being turned on in response to the second control signal, and a fourth driving switch transmitting the voltage of the first level or the voltage of the third level less than the voltage of the first level to the gate electrode of the first transistor when being turned on in response to the second control signal.

While the first driving circuit and the second driving circuit of the driver are turned off, if the first control signal is applied as the gate-on voltage level, the first driving switch and the second driving switch are turned on such that the buffer circuit generates the voltage of the second level as the third output signal, or if the second control signal is applied as the gate-on voltage level, the third driving switch and the fourth driving switch are turned on such that the buffer circuit generates the voltage of the first level or the voltage of the third level as the third output signal.

The circuit element forming the first driving circuit, the second driving circuit, and the buffer circuit is a plurality of transistors, and the plurality of transistors are realized by PMOS transistors or NMOS transistors.

A display device according to an exemplary embodiment of the present invention includes: a display unit including a plurality of pixels connected to a plurality of scan lines transmitting a plurality of scan signals, a plurality of data lines transmitting a plurality of data signals, and a plurality of light emission control lines transmitting a plurality of light emission control signals; a scan driver generating and transmitting a scan signal to a corresponding scan line of the plurality of scan lines; a data driver transmitting a data signal to a plurality of data lines; and a light emission control driver generating and transmitting a light emission control signal to a corresponding light emission control line of the plurality of light emission control lines. The scan driver or the light emission control driver includes: a first driving circuit generating a first output signal; a second driving circuit generating a second output signal; and at least one buffer circuit generating a third output signal of a voltage level corresponding to the gate-on voltage level of the first output signal or the second output signal when the first output signal or the second output signal is transmitted as a gate-on voltage level, and the buffer circuit includes a first transistor transmitting the voltage of the first level as the third output signal, and a second transistor transmitting the voltage of a second level turning off the first transistor and connected to the gate electrode of the first transistor.

The buffer circuit may further include a third transistor connected to the gate electrode of the first transistor and transmitting the voltage of a third level less than the voltage of the first level turning on the first transistor.

The display device according to another exemplary embodiment of the present invention may include the third transistor connected to the gate electrode of the first transistor transmitting the voltage of the first level as the third output signal to the buffer circuit forming the scan driver or the light emission control driver, and transmitting the voltage less than the voltage of the first level.

According to the display device of the present invention, a light emission control driver for generating a light emission control signal variable according to a concurrent light emitting mode or a sequential light emitting mode of a display can be provided. That is, in the display device of the present invention including the light emission control driver using a plurality of light emission control signals as the output signal, the light emission control driver includes a first driving circuit generating a first output signal, a second driving circuit generating a second output signal, and at least one buffer circuit generating a third output signal of a voltage level corresponding to the gate-on voltage level of the first output signal or the second output signal when the first output signal or the second output signal is transmitted as a gate-on voltage level. The buffer circuit may further include: a first driving switch transmitting the voltage of the second level to the gate electrode of the first transistor when being turned on in response to the first control signal; a second driving switch transmitting the voltage of the first level to the gate electrode of the second transistor when being turned on in response to the first control signal; a third driving switch transmitting the voltage of the second level to the gate electrode of the second transistor when being turned on in response to the second control signal; and a fourth driving switch transmitting the to voltage of the first level or the voltage of the third level less than the voltage of the first level to the gate electrode of the first transistor when being turned on in response to the second control signal. When the display unit of the display device is a simultaneous light emitting mode display unit, the first driving circuit and the second driving circuit of the light emission control driver are turned off. If the first control signal is applied as the gate-on voltage level, a plurality of light emission control signals are generated as the gate-off voltage level such that a non-light-emitting period is started, and if the second control signal is applied as the gate-on voltage level, a plurality of light emission control signals are generated as the gate-on voltage level such that the light emitting period is started.

According to an embodiment of the present invention, a driving device operable selectively and variously corresponding to a light emitting method of a display device by controlling a circuit configuration of a driving device and timing of a driving signal is provided to improve image quality and also improve realization of displaying of 3-dimensional (3D) stereoscopic images.

According to a driving device of the embodiment of the present invention, a display device can be driven by generating a driving signal for freely controlling a duty ratio and realizing various timings. Further, a yield of a driver in a display device is improved since it is operable in a thin film transistor circuit with a large off-current, and a driving circuit with a simplified interface is provided by using 3-phase clock signals.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
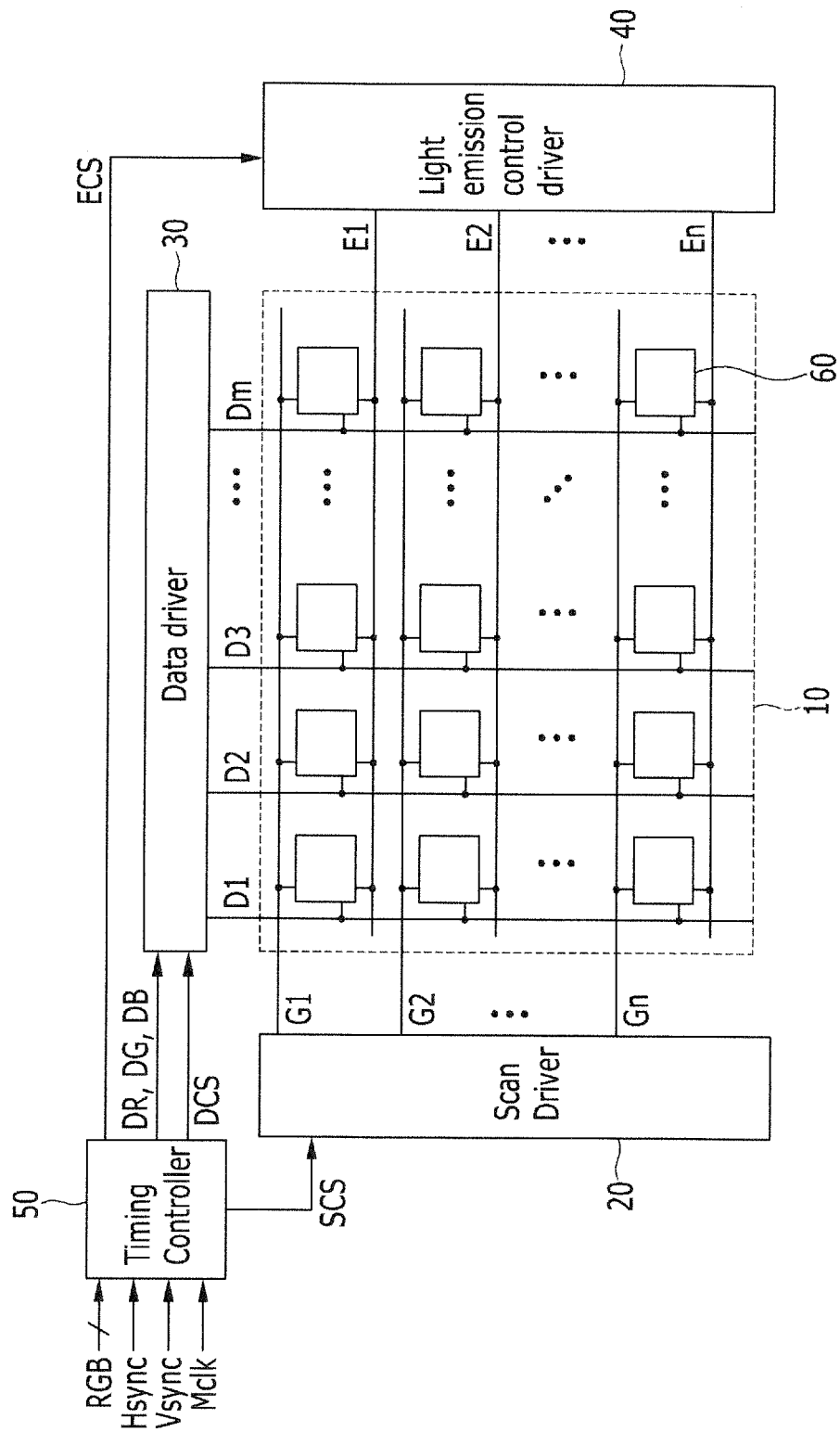
FIG. 1 is a block diagram of a display device according to an exemplary embodiment of the present invention.

Hereinafter, the present invention will be described more fully with reference to the accompanying drawings, in which exemplary embodiments of the invention are shown. As those skilled in the art would realize, the described exemplary embodiments may be modified in various different ways, all without departing from the spirit or scope of the present invention.

Further, like reference numerals denotes like components throughout several exemplary embodiments. A first exemplary embodiment will be representatively described, and therefore only components other than those of the first exemplary embodiment will be described in other exemplary embodiments.

The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 shows a block diagram of a display device according to an exemplary embodiment of the present invention.

Referring to FIG. 1, a display device of FIG. 1 includes a display unit 10, a scan driver 20, a data driver 30, a light emission control driver 40, and a timing controller 50. The display device includes driving devices according to an exemplary embodiment of the present invention including the scan driver 20 and the light emission control driver 40.

The display device of the present invention may be a flat panel display of various kinds such as a liquid crystal display (LCD) and an organic light emitting diode (OLED) display.

The driving device represents a device for generating a driving signal that is a pulse with a predetermined period for controlling the display device and transmitting the same, and it is not restricted to the devices such as the scan driver or the light emission control driver.

In FIG. 1, the scan driver 20 for generating a scan signal for selecting and operating the pixel 60 of the display unit 10 of the display device and transmitting the same to the display unit 10 and the light emission control driver 40 for generating a light emission control signal for controlling light emission of the pixel 60 and transmitting the same to the display unit 10 configure the driving device including the driving circuit according to the embodiment of the present invention.

The display 10 includes a plurality of pixels 60 each connected to a corresponding scan line from among a plurality of scan lines G1 to Gn, a corresponding light emission control line from among a plurality of light emission control lines E1 to En, and a corresponding data line from among a plurality of data lines D1 to Dm in an area where the plurality of scan lines G1 to Gn, the plurality of light emission control lines E1 to En, and the plurality of data lines D1 to Dm cross each other.

The plurality of pixels 60 of the display 10 are arranged in a matrix form. The plurality of scan lines for transmitting the scan signal and the plurality of light emission control lines for transmitting a light emission control signal are arranged in a row direction and are in parallel with each other in the arranged form of the pixels 60, and the plurality of data lines are arranged in a column direction and are parallel with each other.

When the display device according to an exemplary embodiment of the present invention is an organic light emitting diode (OLED) display, the plurality of pixels 60 included in the display 10 respectively include a driving transistor and an organic light emitting diode (OLED). In this instance, a pixel 60 is selected from among the plurality of pixels included in the display 10 by the scan signal that is transmitted through the corresponding scan line from among the plurality of scan lines G1 to Gn, and a driving transistor included in the pixel 60 receives a data voltage caused by a data signal transmitted through the corresponding data line from among the plurality of data lines D1 to Dm, and supplies a current caused by the data voltage to the organic light emitting diode (OLED) to emit it with light of a predetermined luminance. In this instance, light emission of the organic light emitting diode (OLED) of the pixel 60 is controlled by controlling the current to flow to the organic light emitting diode (OLED) by a light emission control signal that is transmitted through the light emission control line from among the plurality of light emission control lines E1 to En.

Therefore, a circuit configuration of a driving device according to an exemplary embodiment of the present invention and a driving waveform for driving the same are applied to the scan driver 20 or the light emission control driver 40 of FIG. 1. A detailed driving device according to an exemplary embodiment of the present invention will be described later with reference to FIGS. 2 and 3.

Referring to FIG. 1, the scan driver 20 connected to a plurality of scan lines G1 to Gn generates a scan signal and transmits it to the plurality of scan lines G1 to Gn. A predetermined row from among a plurality of pixel rows of the display 10 is selected by the scan signal, and a data signal is transmitted through data lines connected to a plurality of pixels.

The data driver 30 connected to a plurality of data lines D1 to Dm generates a data signal and sequentially transmits the data signal to a plurality of pixels included in a row of a plurality of pixel rows of the display 10 through the plurality of data lines D1 to Dm.

The light emission control driver 40 connected to a plurality of light emission control lines E1 to En generates a light emission control signal and transmits it to the plurality of light emission control lines E1 to En. The light emission control driver 40 controls a pulse width of the light emission control signal by the light emitting driving control signal transmitted by the timing controller 50. Also, the light emission control driver 40 controls the light emitting method of the display 10 to be realized as the concurrent light emitting mode or the sequential light emitting mode if needed by equivalently controlling respective pulse voltage levels of the light emission control signals that are transmitted to a plurality of pixels included in a plurality of pixel rows or controlling them to be sequentially changed.

The pixel 60 connected to the light emission control lines E1 to En receives the light emission control signal to determine a time for the current generated by the pixel 60 to flow to the organic light emitting diode (OLED).

The scan driver 20 or the light emission control driver 40 may be realized by a PMOS transistor or an NMOS transistor.

The timing controller 50 receives a video signal RGB that is inputted from an external device, and an input control signal that controls displaying thereof. As examples of the input control signal, there are a vertical synchronization signal Vsync, a horizontal synchronization signal Hsync, and a main clock signal Mclk. The timing controller 50 uses the horizontal synchronization signal Hsync, the vertical synchronization signal Vsync, and the main clock signal Mclk to generate a driving control signal for controlling driving of the scan driver 20, the data driver 30, and the light emission control driver 40. That is, a data driving control signal DCS generated by the timing controller 50 is supplied to the data driver 30, and a scan driving control signal SCS is supplied to the scan driver 20. Also, a light emitting driving control signal ECS is supplied to control an output waveform of the light emission control signal generated by the light emission control driver 40.

Figure 2:
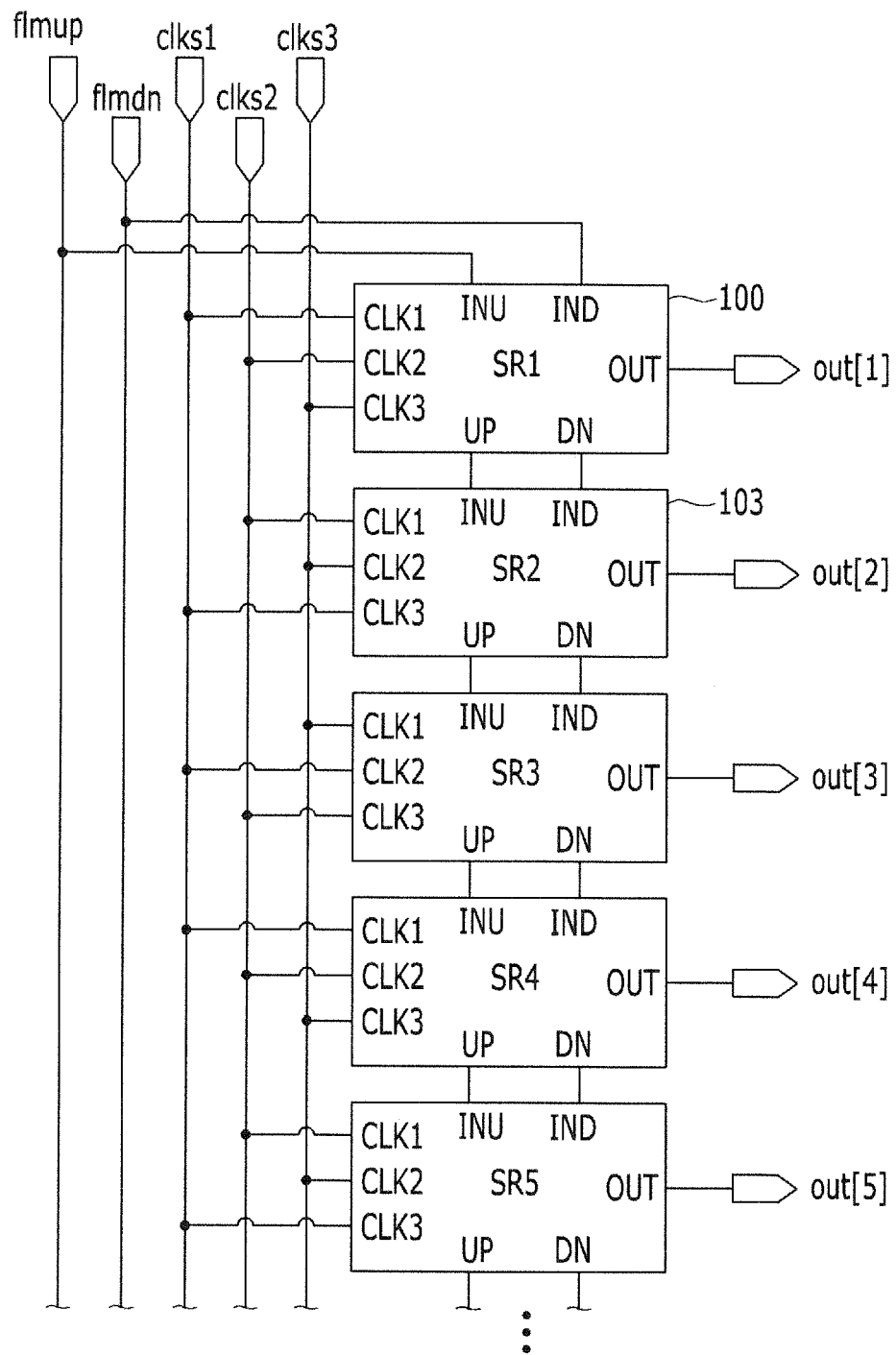
FIG. 2 is a block diagram of an exemplary embodiment of a scan driver or a light emission control driver shown in FIG. 1.

FIG. 2 is a block diagram of one of scan driver 20 or light emission control driver 40 shown in FIG. 1 according to an exemplary embodiment of the present invention. The driving device according to an exemplary embodiment of the present invention is applied to scan driver 20 for generating a scan signal or to light emission control driver 40 for generating a light emission control signal. Constituent elements for sequentially generating a driving signal for controlling various display devices are applicable to the driving device.

Since the driving device shown in FIG. 2 is applicable to the scan driver 20 or the light emission control driver 40 of FIG. 1, it will be called a driving device hereinafter.

The driving device shown in FIG. 2 includes a plurality of shift registers SR (SR1 to SR5 being illustrated) connected to a plurality of outputs lines.

The shift registers SR each include five input terminals and three output terminals.

Although not shown in the block diagram of FIG. 2, in detail, the shift registers SR respectively include a first driver circuit and a second driver circuit for being transmitted with input signals and a buffer circuit for finally generating an output signal. A configuration of these circuits will be described later with reference to FIGS. 3A and 3B.

The input terminals of each of a plurality of shift registers SR include a first input signal terminal INU receiving a first start signal flmup or an interim output signal from the shift register of the previous stage, a second input signal terminal IND receiving a second start signal flmdn or an interim output signal from the shift register of the previous stage, a first clock signal terminal CLK1 receiving a first clock signal, a second clock signal terminal CLK2 receiving a second clock signal, and a third clock signal terminal CLK3 receiving a third clock signal.

The output terminals of each of a plurality of shift registers SR include a first interim output signal terminal UP outputting a first interim output signal and a second interim output signal terminal DN outputting a second interim output signal.

In detail, the first input signal terminal INU, the first clock signal terminal CLK1, the second clock signal terminal CLK2, and the third clock signal terminal CLK3 may be included in the first driving circuit (FIGS. 3A and 3B) of each of a plurality of shift registers.

Also, the second input signal terminal IND, the first clock signal terminal CLK1, the second clock signal terminal CLK2, and the third clock signal terminal CLK3 may be included in the second driving circuit (FIGS. 3A and 3B) of each of a plurality of shift registers.

The first input signal terminal INU of shift register SR1 of the first stage receives the first start signal flmup. The first input signal terminal INU of each succeeding stage shift register SR2, SR3, SR4, SR5, . . . receives a first interim output signal transmitted from the first interim output signal terminal UP of the shift register of an adjacent previous stage.

Also, the second input signal terminal IND of shift register SR1 of the first stage receives the second start signal flmdn. The second input signal terminal IND of each succeeding stage shift register SR2, SR3, SR4, SR5, . . . receives the second interim output signal transmitted from the second interim output signal terminal DN of the shift register of an adjacent previous stage.

In the driver according to an exemplary embodiment of the present invention, three clock signal terminals included in each of a plurality of shift registers are alternately transmitted with different clock signals.

That is, the 3-phase clock signals are repeatedly input to the clock signal terminals by changing the transfer pattern for the stage of each succeeding shift register, as follows.

Referring to FIG. 2, the first clock signal terminal CLK1, the second clock signal terminal CLK2, and the third clock signal terminal CLK3 of the shift register SR1 of the first stage respectively receive a first clock signal clks1, a second clock signal clks2, and a third clock signal clks3.

However, the first clock signal terminal CLK1, the second clock signal terminal CLK2, and the third clock signal terminal CLK3 of the shift register SR2 of the second stage as the next stage respectively receive the second clock signal clks2, the third clock signal clks3, and the first clock signal clks1.

Also, the first clock signal terminal CLK1, the second clock signal terminal CLK2, and the third clock signal terminal CLK3 of the third stage shift register SR3 respectively receive the third clock signal clks3, the first clock signal clks1, and the second clock signal clks2.

Next, from the shift register SR4 of the fourth stage, the 3-phase clock signals are repeatedly input to the clock signal terminals by changing the transfer pattern for the stage of each succeeding shift register through the above-described method.

On the other hand, three output terminals of each of a plurality of shift registers SR include the first interim output signal terminal UP generating and outputting the first interim output signal, the second interim output signal terminal DN generating and outputting the second interim output signal, and the output signal terminal OUT generating and transmitting the output signal of the final shift register of the corresponding stage.

In detail, the first interim output signal terminal UP may be included in the first driving circuit (FIGS. 3A and 3B) of each of a plurality of shift registers.

The second interim output signal terminal DN may be included in the second driving circuit (FIGS. 3A and 3B) of each of a plurality of shift registers.

Figure 3A:
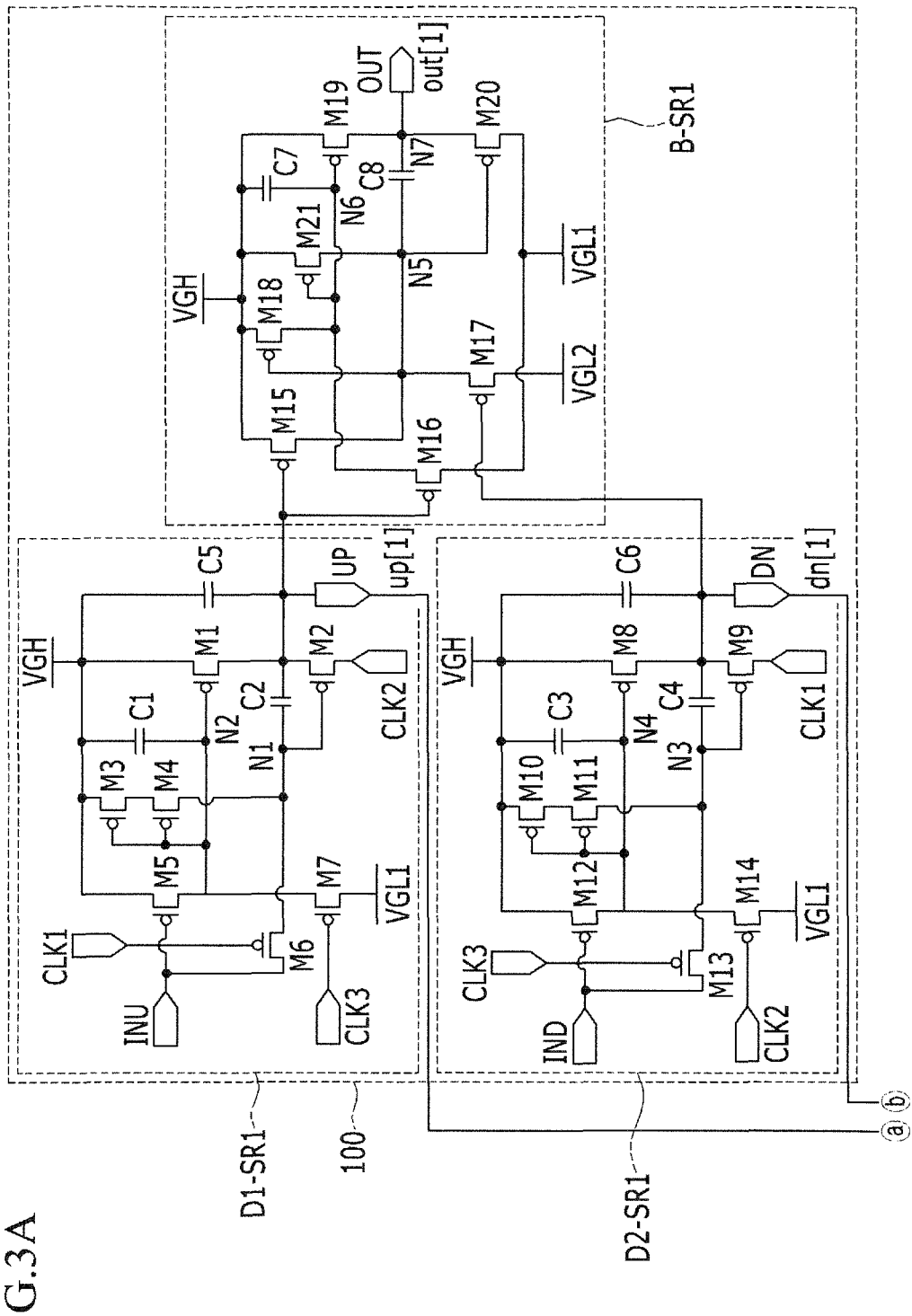
FIG. 3A and FIG. 3B are circuit diagrams of an exemplary embodiment of a scan driver or a light emission control driver shown in FIG. 2.
Figure 3B:
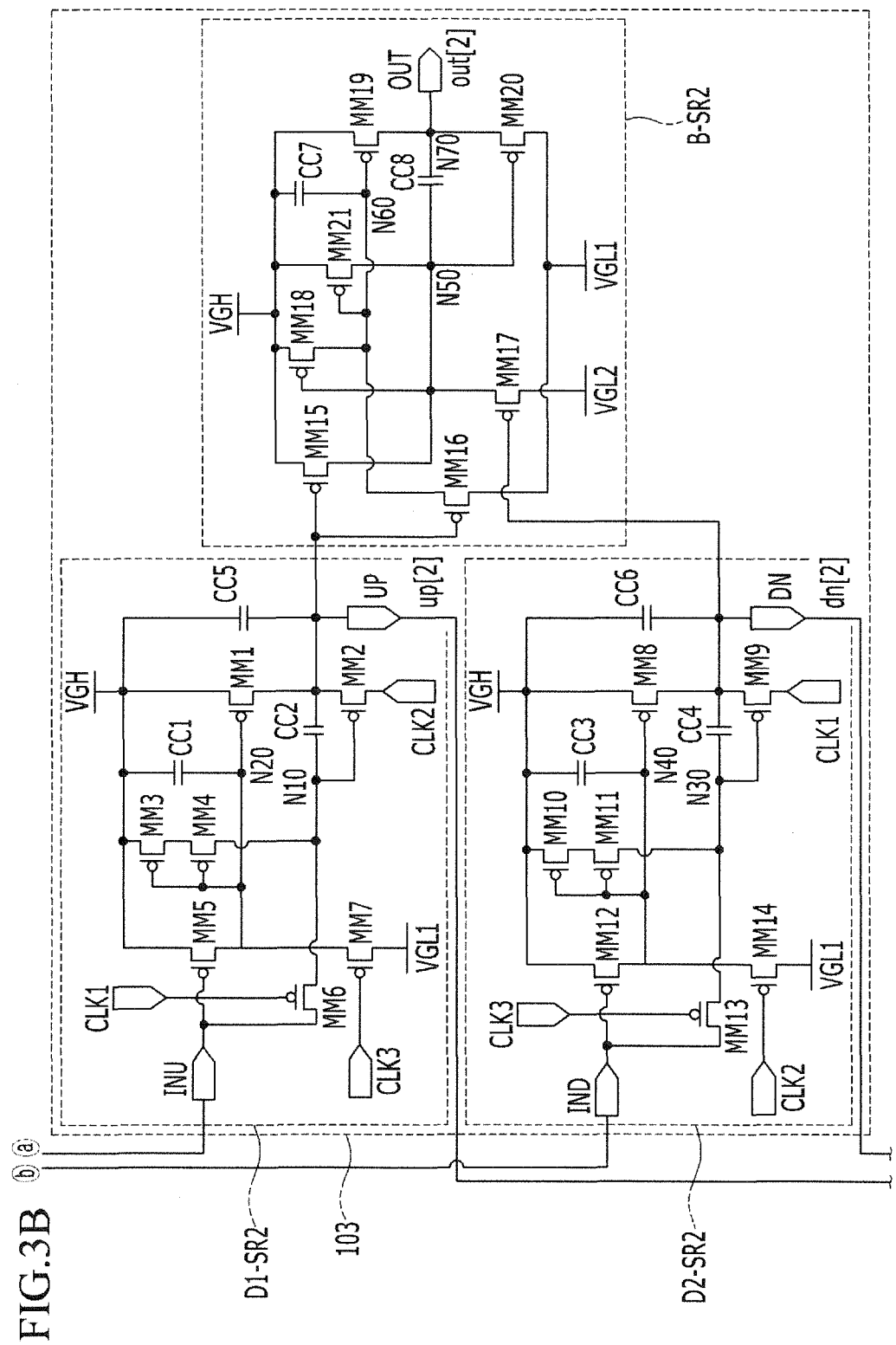

Also, the output signal terminal OUT may be included in the buffer circuit FIGS. 3A and 3B) of each of a plurality of shift registers.

Referring to FIG. 2, the first stage shift register SR1 is driven by the signals supplied to the input terminals to generate the first interim output signal and the second interim output signal, and finally generates and outputs the output signal out[1] of the first stage shift register SR1 in response to the first interim output signal and the second interim output signal.

Here, as the middle process, the first interim output signal is transmitted from the first interim output signal terminal UP of the shift register SR1 of the first stage to the first input signal terminal INU of the shift register SR2 of the second stage. Also, the second interim output signal is transmitted from the second interim output signal terminal DN of the shift register SR1 of the first stage to the second input signal terminal IND of the shift register SR2 of the second stage. Thus, the shift register SR2 of the second stage is driven such that the output signal out[2] of the shift register SR2 of the second stage is generated and output through the output signal terminal out[2]. This process is sequentially executed for every shift register.

The block diagram of a plurality of shift registers of the driving device shown in FIG. 2 is only an exemplary embodiment and is not limited thereto.

Referring to FIG. 2, an interface of the driving device may be configured by using the 3-phase clock signals, and the circuit configuration is simple to generate driving signals with various timings required by a large panel and economical circuit design is realized.

FIGS. 3A and 3B show detailed circuit diagrams of a driving device according to an exemplary embodiment of the present invention described with reference to the block diagram of FIG. 2. The circuit diagrams of FIG. 3A and FIG. 3B are applicable to a display device configuration such as a scan driver or a light emission control driver according to timing control of driving signals generated by a driving device.

FIG. 3A shows a first shift register 100 (e.g., SR1) from among a plurality of shift registers of a driving device of FIG. 2, and FIG. 3B shows the second shift register 103 (e.g., SR2) as the next state.

In FIG. 3A, first shift register 100 includes first driving circuit D1-SR1 and second driving circuit D2-SR1, and a buffer circuit B-SR1 finally generating the output signal out [1] of the first shift register 100 in response to the interim output signal output from the driving circuit.

Of course, in FIG. 3B, second shift register 103 includes first driving circuit D1-SR2 and second driving circuit D2-SR2, and a buffer circuit B-SR2 finally generating the output signal out[2] of the second shift register in response to the interim output signal output from the driving circuit.

In FIG. 3A, the first driving circuit D1-SR1 of the first shift register 100 receives the first start signal flmup at the first input signal terminal INU to generate the first interim output signal up[1] of the first stage. Here, the first interim output signal up[1] is transmitted to the first input signal terminal INU of the first driving circuit D1-SR2 of the second shift register 103 in FIG. 3B, and is simultaneously transmitted to the buffer circuit B-SR1 of the first stage.

Also, the second driving circuit D2-SR1 of the first shift register 100 receives the second start signal flmdn at the second input signal terminal IND to generate the second interim output signal dn[1] of the first stage. Here, the second interim output signal dn[1] is transmitted to the second input signal terminal IND of the second driving circuit D2-SR2 of the second shift register 103 in FIG. 3B, and is simultaneously transmitted to the first stage buffer circuit B-SR1.

The buffer circuit B-SR1 of the first shift register 100 is driven in response to the first interim output signal up[1] and the second interim output signal dn[1] and finally generates first stage output signal out[1].

The process in which the first interim output signal up[1] is generated from the first driving circuit D1-SR1 of the first shift register 100 uses the first clock signal clks1 transmitted to the first clock signal terminal CLK1 and the second clock signal clks2 transmitted to the second clock signal terminal CLK2. Also, as the control signal, the third clock signal clks3 transmitted to the third clock signal terminal CLK3 is used.

The process in which the second interim output signal dn[1] is generated in the second driving circuit D2-SR1 of the first shift register 100 uses the third clock signal clks3 transmitted to the third clock signal terminal CLK3 and the first clock signal clks1 transmitted to the first clock signal terminal CLK1. Also, the second clock signal clks2 transmitted to the second clock signal terminal CLK2 is used as the control signal.

The circuit structure of the second shift register 103 of FIG. 3B connected to the first shift register 100 is also not much different from the first shift register 100, however it is different in that the first clock signal terminal CLK1 receives the second clock signal clks2, the second clock signal terminal CLK2 receives the third clock signal clks3, and the third clock signal terminal CLK3 receives the first clock signal clks1.

The circuit diagram of the first shift register 100 of FIG. 3A will be described in detail.

The first shift register 100 includes transistors M1 to M21 and a first capacitor C1 to an eighth capacitor C8, however it is not limited thereto.

In the first driving circuit of the first shift register 100, transistor M1 includes a source electrode connected to a first power source voltage VGH of a high potential, a gate electrode connected to a node N2 where a drain electrode of transistor M5 and one terminal of a first capacitor C1 are connected, and a drain electrode connected to the interim output terminal UP.

Transistor M1 outputs the high potential voltage value of the first power source voltage VGH as the first interim output signal up[1] of the first interim output signal terminal UP under a turn-on state.

Second capacitor C2 is connected between a gate electrode and a drain electrode of transistor M2 having a source electrode connected to the second clock signal terminal CLK2.

Transistor M2 receives the second clock signal clks2 through the second clock signal terminal CLK2 under a turn-on state and outputs the first interim output signal up[1] as the value corresponding thereto.

Transistors M3 and M4 are connected between the first power source voltage VGH and a node N1 where the gate electrode of transistor M2 and one terminal of the second capacitor C2 are connected.

In FIG. 3A, two transistors M3 and M4 are dually provided, however it is not limited thereto, and one transistor may be provided or not.

In detail, transistor M3 includes a source electrode connected to the first power source voltage VGH, a gate electrode connected to node N2, and a drain electrode connected to a source electrode of transistor M4.

Also, transistor M4 includes a source electrode connected to the drain electrode of transistor M3, a gate electrode connected to node N2, and a drain electrode connected to node N1.

Transistors M3 and M4 are turned on such that the high potential voltage of the first power source voltage VGH is transmitted to node N1, and is transmitted to the gate electrode of transistor M2 such that transistor M2 is turned off.

On the other hand, a transistor M5 includes a source electrode connected to the first power source voltage VGH, a gate electrode connected to the first input signal terminal INU to receive the first start signal flmup, and a drain electrode connected to node N2. Transistor M5 transmits the high potential voltage of the first power source voltage VGH under a turn-on state to the gate electrode of transistor M1 to turn off of transistor M1.

Transistor M6 includes a gate electrode connected to the first clock signal terminal CLK1 to receive the first clock signal clks1, a source electrode connected to the first input signal terminal INU to receive the first start signal flmup, and a drain electrode connected to node N1. Here, transistor M6 transmits the value of the first input signal terminal INU to node N1 under a turn-on state to store it to the second capacitor C2.

Transistor M7 includes a source electrode connected to a second power source voltage VGL1 of a low potential, a gate electrode connected to the third clock signal terminal CLK3 to receive the third clock signal clks3, and a drain electrode connected to node N2. Here, the voltage value of the second power source voltage VGL1 is lower than the voltage value of the first power source voltage VGH, and it is not limited.

According to the case, the voltage of the second power source voltage VGL1 may be set as the further lower value to have the voltage difference of more than two times the threshold voltage of a transistor M20 connected to the output terminal of buffer circuit B-SR1 that will be described.

On the other hand, the second driving circuit D2-SR1 of the first shift register 100 is similar to the configuration of the first driving circuit D1-SR1, the transistors M1 to M7 of the first driving circuit D1-SR1 correspond to transistors M8 to M14 of the second driving circuit D2-SR1, and the first and second capacitors C1 and C2 of the first driving circuit D1-SR1 respectively correspond to the third and fourth capacitors C3 and C4 of the second driving circuit D2-SR1.

According to the embodiment, the first driving circuit D1-SR1 or the second driving circuit D2-SR1 of the first shift register 100, respectively, may further include a fifth capacitor C5 or sixth capacitor C6 connected between the interim output terminal and the first power source voltage VGH.

The buffer circuit B-SR1 of the first shift register 100 generates the output signal out[1] corresponding to the first interim output signal up[1] transmitted from the first driving circuit D1-SR1 or the second interim output signal dn[1] transmitted from the second driving circuit D2-SR1.

The buffer circuit B-SR1 includes transistors M15 to M21, a seventh capacitor C7, and an eighth capacitor C8.

Transistor M15 includes a gate electrode connected to the first interim output signal terminal UP to receive the first interim output signal up[1], a source electrode connected to the first power source voltage VGH of a high potential, and a drain electrode connected to a node N5. Transistor M15 transmits the voltage of the first power source voltage VGH of a high potential to node N5 under a turn-on state to turn off the switching operation of a transistor M20.

Transistor M16 includes a gate electrode connected to the first interim output signal terminal UP to receive the first interim output signal up[1], a source electrode connected to the second power source VGL1 of a low potential, and a drain electrode connected to a node N6. Transistor M16 transmits the voltage of the second power source voltage VGL1 of the low potential to node N6 under a turn-on state to turn on the switching operation of transistor M19.

Transistor M17 includes a gate electrode connected to the second interim output signal terminal DN to receive the second interim output signal dn[1], a source electrode connected to a third power source voltage VGL2 less than the second power source voltage VGL1, and a drain electrode connected to node N5 where a gate electrode of a transistor M18 and a gate electrode of transistor M20 are connected. Accordingly, transistor M17 applies the third power source voltage VGL2 of the low potential to node N5 under a turn-on state and turns on transistor M18 and transistor M20.

Transistor M18 includes a gate electrode connected to the drain electrode of transistor M17, a source electrode connected to the first power source voltage VGH of the high potential, and a drain electrode connected to node N6.

On the other hand, transistor M19 includes a gate electrode connected to node N6 that a drain electrode of transistor M18 and a drain electrode of transistor M16 are connected to, a source electrode of transistor M19 is connected to the first power source voltage VGH of the high potential, and a drain electrode of transistor M19 is connected to a node N7 where the output terminal OUT and a drain electrode of transistor M20 are commonly connected. Accordingly, transistor M19 outputs the first power source voltage VGH of the high potential as the voltage level of the output signal out[1] under a turn-on state. That is, when transistor M19 is turned on, the pulse state of the output signal out[1] is the high level.

Transistor M20 includes a gate electrode connected to node N5 where the drain electrode of transistor M15 and the drain electrode of transistor M21 are connected, a source electrode of transistor M20 is connected to the second power source voltage VGL1 of the low potential, and a drain electrode of transistor M20 is connected to node N7 where the output terminal OUT and the drain electrode of transistor M19 are connected. Accordingly, transistor M20 outputs the second power source voltage VGL1 of the low potential as the voltage level of the output signal out[1] under a turn-on state. That is, when transistor M20 is turned on, the pulse state of the output signal out[1] is the low level.

Transistor M21 includes a gate electrode connected to node N6, a source electrode connected to the first power source voltage VGH, and a drain electrode connected to node N5.

Transistor M21 transmits the high level voltage of the first power source voltage VGH to the gate electrode of transistor M20 through node N5 under a turn-on state such that the off operation of transistor M20 may be stably maintained. Accordingly, it has the function of stably maintaining the positive polarity of the high level of the final output signal out[1] output from the output terminal during a predetermined time.

Also, one terminal of seventh capacitor C7 is connected to the first power source voltage VGH of the high potential, and the other terminal thereof is connected to node N6 as the common node of the gate electrodes of the transistors M19 and M21.

The eighth capacitor C8 diode-connects the gate electrode and the drain electrode of transistor M20 and temporarily stores the voltage transmitted to transistor M20.

@ In FIG. 3A, if the first start signal flmup and the first clock signal clks1 of the first driving circuit D1-SR1 are synchronized and input as low level pulses, the second capacitor C2 is charged with the low voltage such that transistor M2 is turned on. Also, transistor M5 is turned on such that the first power source voltage VGH of the high level is transmitted to transistor M1 to be turned off. Transistor M2 is in the turned-on state such that if the voltage level of the second clock signal clks2 is low, the first interim output signal up[1] becomes the low level, and then if the voltage level of the second clock signal clks2 becomes high, it is output as the high level. Next, if the voltage level of the third clock signal clks3 is low, transistor M7 is turned on such that the first power source voltage VGH of the high potential is applied to node N1 through the transistors M3 and M4 to discharge the second capacitor C2, and then the output of the first interim output signal up[1] is maintained high without the influence of the second clock signal clks2.

Of course, if the second start signal flmdn and the third clock signal clks3 are synchronized in the second driving circuit D2-SR1 and are input as low level pulses, the fourth capacitor C4 is charged to the low voltage such that transistor M9 is turned on, and transistor M12 is turned on such the first power source voltage VGH of the high level is transmitted to transistor M8 to be turned off. Accordingly, if the voltage level of the first clock signal clks1 is low, the second interim output signal dn[1] becomes the low level, and then if the voltage level of the first clock signal clks1 becomes high, the second interim output signal dn[1] becomes the high level. Next, if the voltage level of the second clock signal clks2 becomes low, transistor M14 is turned on such that the first power source voltage VGH of the high potential is applied to node N3 through transistors M10 and M11 to discharge the fourth capacitor C4, and then the output of the second interim output signal dn[1] is continuously maintained high without the influence to the first clock signal clks1.

In the buffer circuit B-SR1, when the first interim output signal up[1] is low, transistor M20 is turned off by the turn-on of the transistors M15 and M16 and the transistors M19 and M21 are turned on such that the output signal out[1] is output as the high level according to the first power source voltage VGH.

Here, the high potential voltage of the first power source voltage VGH is applied to the gate electrode of transistor M20 by the turn-on of transistor M21 such that the turn-off of transistor M20 may be maintained for a long time when the output signal out[1] is high. That is, even if the leakage current (the off current) of transistor M20 is high, the operation of transistor M21 is possible such that the operation margin is increased and the yield of the driver is improved. According to the driving circuit of the present invention, the high level of the output signal may be correctly maintained for a long time during the predetermined period.

On the other hand, when the second interim output signal dn[1] is low in the buffer circuit B-SR1, the gate electrode of transistor M20 is applied with the third power source voltage VGL2 lower than the second power source voltage VGL1 by the turn-on of transistor M17 such that it is turned on. Also, transistor M18 is simultaneously turned on such that the first power source voltage VGH is applied to the gate electrode of transistor M19 to be turned off.

Accordingly, the output signal out[1] receives the low potential voltage of the second power source voltage VGL1 through transistor M20 such that it is output as the low level. That is, to set the cycle of the low level output from the driver, the present invention controls the driving of the second driving circuit D2-SR1 such that the second interim output signal dn[1] is output as the low level.

The voltage value of the third power source voltage VGL2 is not restricted and will be desirable to be less than the second power source voltage VGL1, and it can also have the following condition.

$$VGL2 < VGL1 - 2Vth$$

Here, Vth represents a threshold voltage value of a transistor connected to an output terminal. In the present exemplary embodiment, it means the threshold voltage value of transistor M20.

Also, the driving circuit adds the third power source voltage VGL2 that is less than the second power source voltage VGL1 to reduce the voltage at the gate electrode of transistor M20 to be less than the voltage at the source electrode and thereby stably maintain the output voltage. Therefore, the operational margin of the transistor is substantially improved and the yield of the display device using the driving device is improved.

The second shift register 103 of FIG. 3B includes transistors MM1 to MM21 and a first capacitor CC1 to an eighth capacitor CC8, however it is not limited thereto.

In the second shift register 103 of FIG. 3B, the first input signal terminal INU of the first driving circuit D1-SR2 receives the first interim output signal up[1] output from the first driving circuit of the first shift register 100. Here, the first interim output signal up[1] transmitted to the first input signal is in synchronization with the second clock signal clks2 input to the first clock signal terminal CLK1. Thus, the first driving circuit D1-SR2 of the second shift register SR2 generates the first interim output signal up[2].

In a like manner, in the second shift register 103, the second input signal terminal IND of the second driving circuit D2-SR2 receives the second interim output signal dn[1] output from the second driving circuit of the first shift register 100. Here, the second interim output signal dn[1] transmitted with the second input signal is in synchronization with the first clock signal clks1 input to the third clock signal terminal CLK3. Thus, the second driving circuit D2-SR2 of the second shift register SR2 generates the second interim output signal dn[2].

The buffer circuit B-SR2 of the second shift register 103 generates the output signal out[2] in response to the generated first interim output signal up[2] or the generated second interim output signal dn[2]. The remaining detailed configuration of FIG. 3B is the same as that of FIG. 3A such that the description thereof is omitted.

Detailed driving of the driving device shown in FIGS. 3A and 3B following a drive timing diagram of FIG. 4 will now be described.

Figure 4:
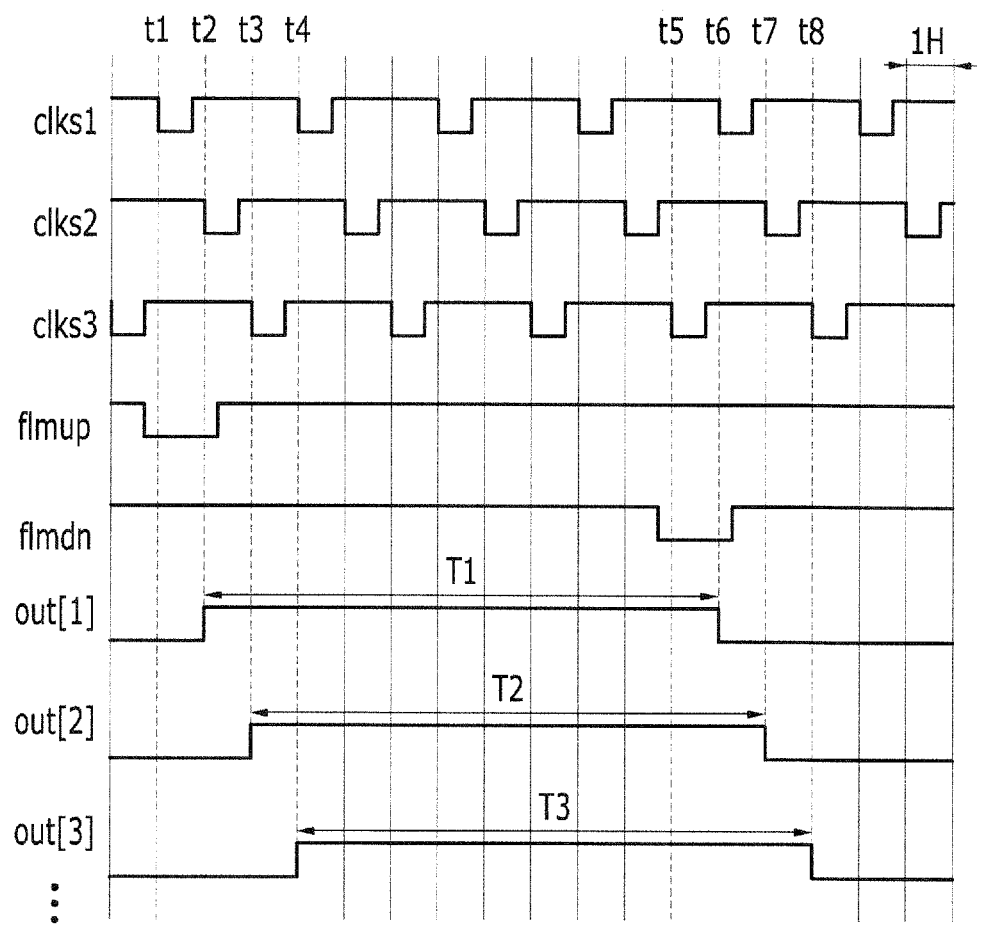
FIG. 4 shows a driving timing diagram of a circuit diagram shown in FIGS. 3A and 3B.

The driving timing diagram of FIG. 4 shows an output signal waveform of a driver sequentially output and started by the first stage shift register 100.

Each transistor shown in the circuit diagram of FIGS. 3A and 3B exemplifies a PMOS transistor, so the signal waveform of FIG. 4 is operable with reference to the low level pulse. However, this is only one exemplary embodiment, and it is not limited thereto.

Referring to FIG. 4, the first clock signal clks1, the second clock signal clks2, and the third clock signal clks3 that are input to the driving of the present invention have low-level pulses that are repeated with a predetermined period.

The predetermined period is 2 horizontal periods 3H, however it is not limited thereto.

The first clock signal clks1, the second clock signal clks2, and the third clock signal clks3 have a phase difference of ⅓ cycle 1H.

Referring to FIG. 4, firstly at the time t1, the first clock signal clks1 and the first start signal flmup are synchronized and transmitted to the first driving circuit D1-SR1 of the first shift register 100 as the low level. Thus, transistor M2 is turned on, and simultaneously transistor M1 transmitted with the first power source voltage VGH is turned off. Also, the first interim output signal up[1] is output according to the pulse level of the second clock signal clks2. Accordingly, the first interim output signal up[1] of the low level is output at the time t2. Thus, as above-described, the first interim output signal up[1] of the low level is transmitted to the buffer circuit B-SR1 to turn on the transistors M15 and M16 such that transistor M20 is turned off by the high potential voltage of the first power source voltage VGH, and simultaneously the high level voltage of the first power source voltage VGH is generated as the output signal out[1] of the first shift register through transistor M19.

Here, transistor M21 is simultaneously turned on by the low potential voltage of the second power source voltage VGL2 transmitted to node N6 such that the voltage of the gate electrode of transistor M20 is maintained as the high potential voltage of the first power source voltage VGH, and thereby the output signal out[1] may be stably maintained as the high level during the period T1.

Accordingly, the driving device can be stably operated in the case of a transistor with a large leakage current.

The output signal out[1] is maintained as the high level during the period T1, and the third clock signal clks3 and the second start signal flmdn are synchronized and transmitted to the second driving circuit D2-SR1 of the first shift register 100 as the low level at the time t5. Thus, the second interim output signal dn[1] of the low level is output at the time t6. The second interim output signal dn[1] of the low level is transmitted to the buffer circuit B-SR1 to turn-on transistor M17 such that the transistors M18 and M20 are switched on. Thus, transistor M19 outputting the first power source voltage VGH of the high level to the output signal out[1] is turned off, and the second power source voltage VGL1 of the low level is generated as the output signal out[1] by the turned on transistor M20.

The cycle T1 of the first stage output signal out[1] is the period from the time t2 to at the time t6, and the duty ratio of the output signal may be controlled by adjusting the cycle of the input clock signals.

The shift registers of the next stage repeatedly drive to sequentially generate output signals.

That is, the first input signal of the first driving circuit D1-SR1 of the first stage shift register 100 (FIG. 3A) is the first start signal flmup, however the first input signal of the second stage shift register 103 (FIG. 3B) of the next stage is the first interim output signal up[1] output from the first shift register. Here, the first interim output signal up[1] is transmitted to the first input signal terminal INU of the first driving circuit of the second shift register 103 at the time t2. Here, it is in synchronization with the second clock signal clb2 input to the first clock signal terminal CLK1 and transmitted. Thus, the first interim output signal up[2] is output according to the pulse level of the third clock signal clks3 at the time t3. Next, the buffer circuit B-SR2 receiving the first interim output signal up[2] transmitted according to the low level of the third clock signal clks3 generates the second stage output signal out[2] as the high level at the time t3.

On the other hand, the second input signal terminal IND of the second stage shift register 103 receives the second interim output signal dn[1] output from the first shift register 100 as the second input signal at the time t6, and here is synchronized with the first clock signal clb1 input to the third clock signal terminal CLK3. Thus, the second interim output signal dn[2] is output according to the pulse level of the second clock signal clks2 at the time t7. Next, the buffer circuit B-SR2 receiving the second interim output signal dn[2] transmitted according to the low level of the second clock signal clks2 generates the second stage output signal out[2] as the low level at the time t7.

The output signal out[2] of the second shift register 103 is changed into the high state in response to the third clock signal clks3 at the time t3, and is changed into the low state in response to the second clock signal clks2 at the time t7. Next, the output signals of the shift registers are sequentially generated by the phase difference 1H of the clock signals.

The cycle of the output signals may be controlled by adjusting the cycle of the clock signals and the phase difference between the clock signals such that a driver capable of easily controlling the duty ratio may be provided according to the present invention.

Also, the embodiment is flexibly applicable to the scan driver and the light emission control driver since various driving timings required by the large-panel display device can be realized.

Figure 5:
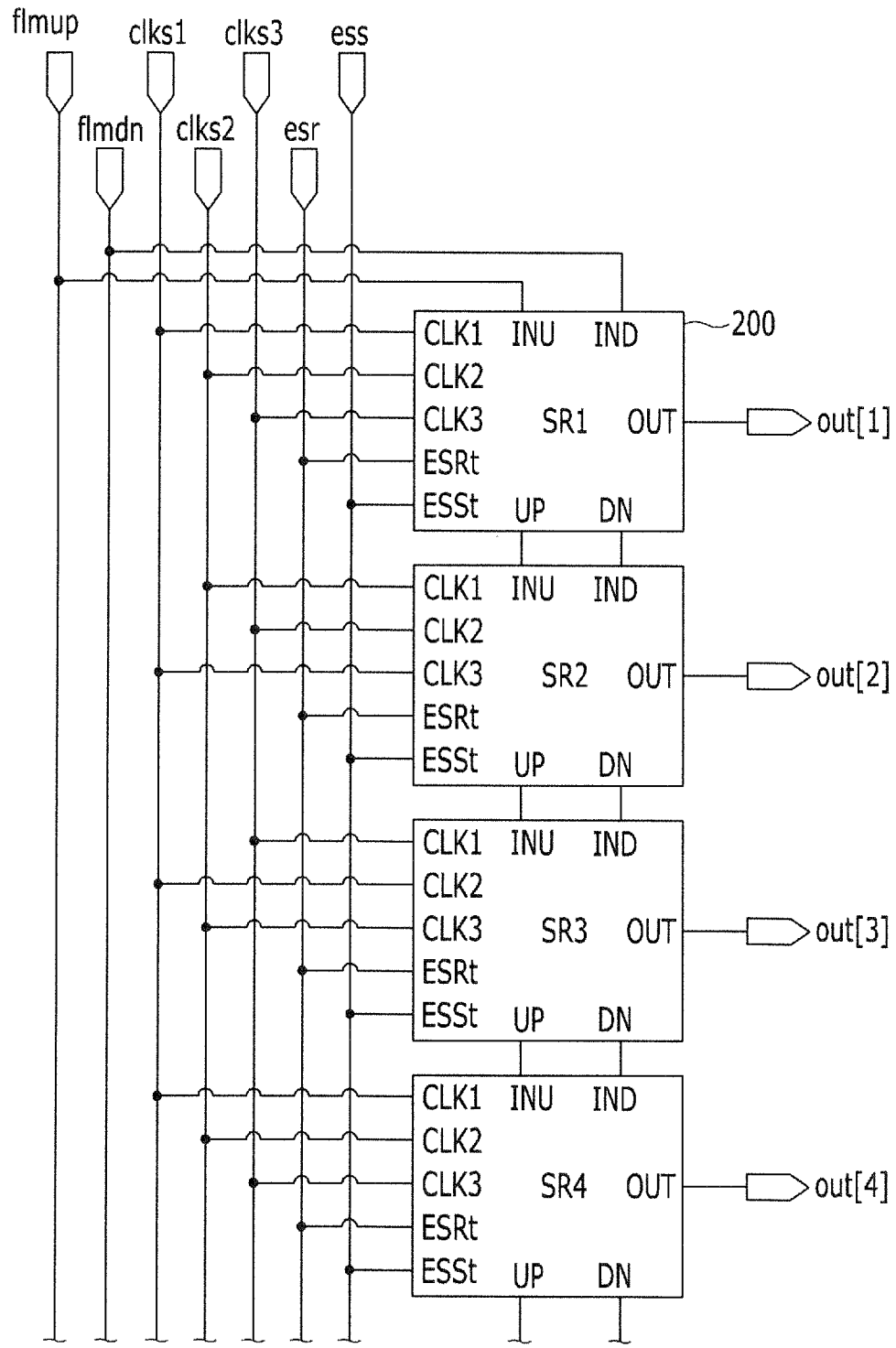
FIG. 5 is a block diagram of another exemplary embodiment of a scan driver or a light emission control driver shown in FIG. 1.
Figure 6:
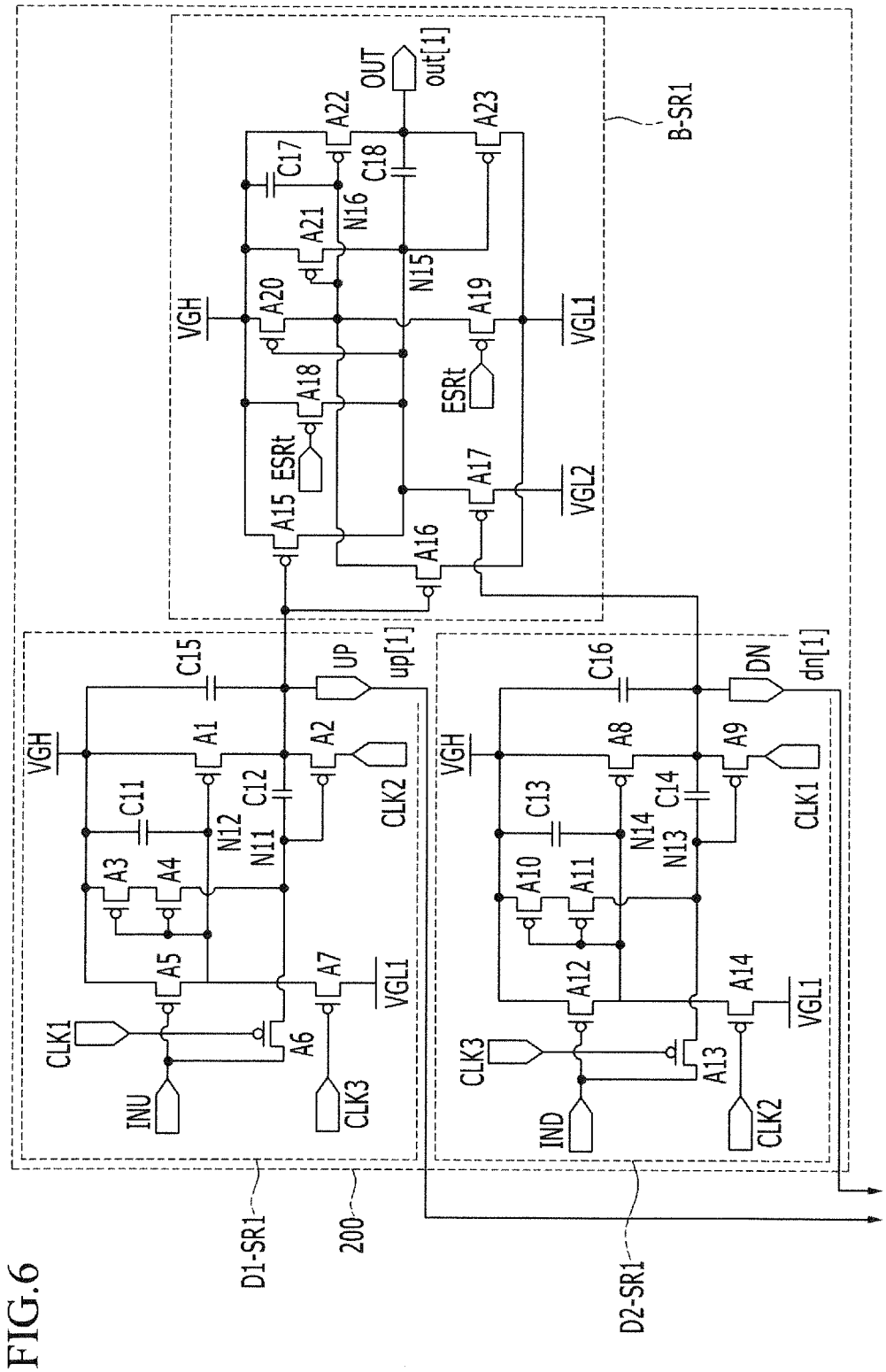
FIG. 6 is a circuit diagram of an exemplary embodiment of a scan driver or a light emission control driver shown in FIG. 5.
Figure 7:
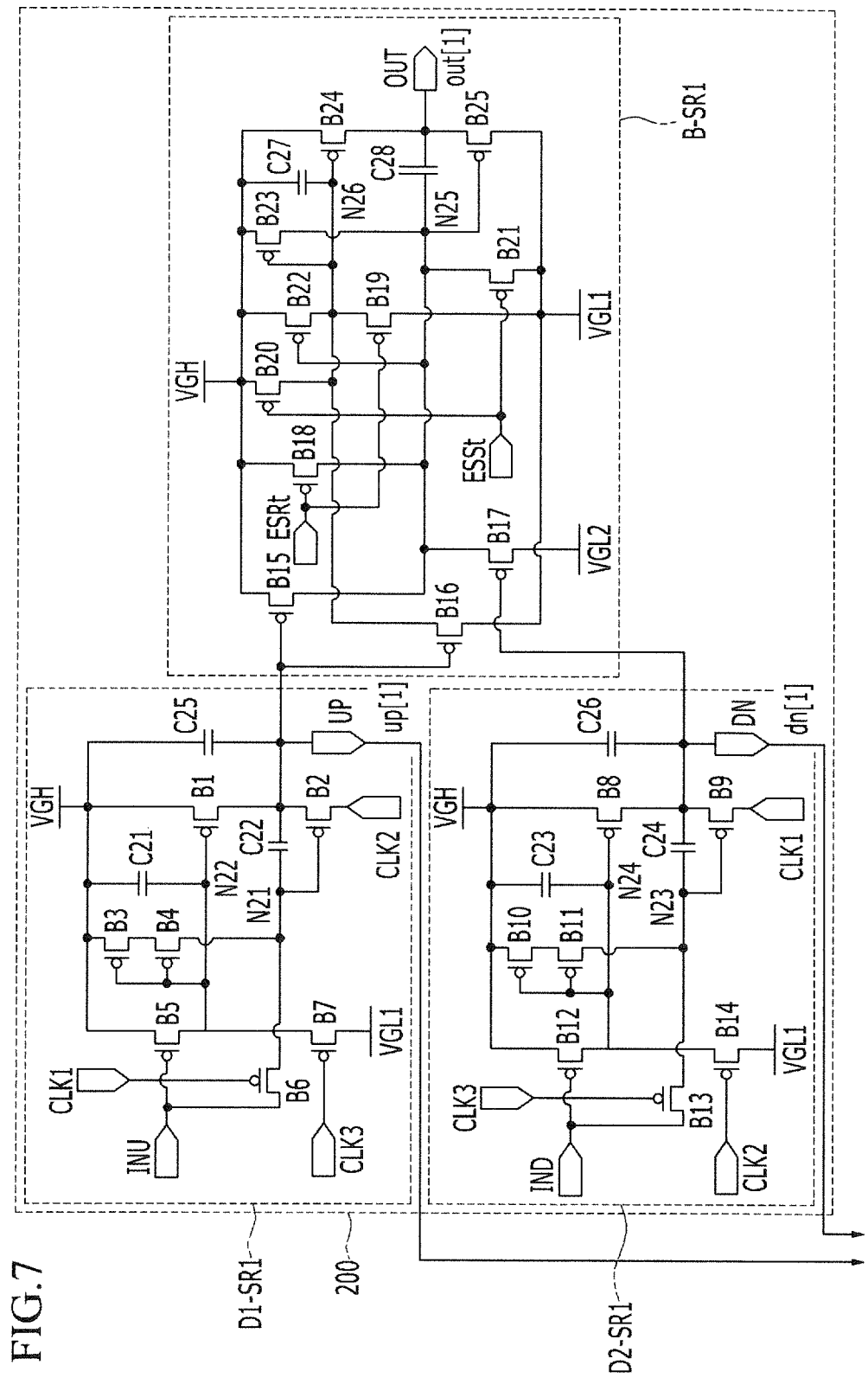
FIG. 7 is a circuit diagram of another exemplary embodiment of a scan driver or a light emission control driver shown in FIG. 5.

FIG. 5 is a block diagram of another exemplary embodiment of a scan driver or a light emission control driver shown in FIG. 1, and FIG. 6 and FIG. 7 are various circuit diagrams according thereto.

The light emission control driver according to the exemplary embodiment of FIG. 5 to FIG. 7 may generate the light emission control signal capable of being simultaneously applied to the simultaneous light emitting mode or the sequential light emitting mode.

The block diagram of FIG. 5 is not much different from that of FIG. 2, and the shift register of the driver may include at least input signal terminals.

In detail, each shift register shown in FIG. 5 may include the first control signal terminal ESRt receiving the first control signal esr and the second control signal terminal ESSt receiving the second control signal ess. Although not shown in FIG. 5, the first control signal terminal ESRt and the second control signal terminal ESSt are included in the buffer circuit of each shift register.

A plurality of shift registers forming the driving circuit may simultaneously or sequentially generate a plurality of output signals in response to the first control signal esr and the second control signal ess.

The circuit diagrams of FIG. 6 and FIG. 7 show a shift register corresponding to the first stage for better understanding and ease of description, and the mutual relationship for the input and output signals of the shift register of the next stage is the same as described above.

FIG. 6 and FIG. 7 show a circuit for the light emission control driver 40 particularly applicable to a 3D stereoscopic image display device, available for simultaneous light emission or sequential light emission for 3D realization. The simultaneous light emitting mode controls an on voltage level and an off voltage level of the light emission control signal in order for all the pixels included in the display 10 to emit light according to the stored data signal.

Referring to FIG. 6 and FIG. 7, the configuration and operation of the first driving circuit D1-SR1 or the second driving circuit D2-SR1 of the first shift register 200 (SR1) correspond to those of the driver circuit of FIG. 3A.

FIG. 6 shows a different configuration and operation of the buffer B-SR1, and the control signal terminal ESRt is added and the control signal terminal ESRt is input with a predetermined control signal esr.

In detail, the buffer circuit B-SR1 of FIG. 6 adds a transistor A18 between the first power source voltage VGH and a gate terminal of transistor A23. That is, transistor A18 includes a gate electrode connected to the first control signal terminal ESRt transmitted with the first control signal esr, a source electrode connected to the first power source voltage VGH, and a drain electrode connected to node N15 connected to a gate terminal of transistor A23.

Also, transistor A19 is further included between the second power source voltage VGL1 and a node N16 that gate electrodes of transistors A21 and A22 and a drain electrode of transistor A16 are connected to. That is, transistor A19 includes a gate electrode connected to the first control signal terminal ESRt transmitted with the first control signal esr, a source electrode connected to the second power source voltage VGL1, and a drain electrode connected to node N16.

The gate electrodes of transistor A18 and transistor A19 are all input with the first control signal esr, and the first control signal esr controls the switching operation of transistors A18 and A19.

That is, during the time that the first control signal esr is applied as the low level, transistor A18 and transistor A19 are turned on such that transistor A23 is turned off, and simultaneously transistors A21 and A22 are turned on to maintain the output signal out[1] as the high level. In this instance, the output signal out[1] of the high level is stably generated by the voltage of the high level transmitted to the gate electrode of transistor A23 through transistor A21 although transistor A23 has a large off current.

On the other hand, if the first control signal esr is applied as the high level, transistor A18 and transistor A19 are all turned off such that the buffer circuit B-SR1 generates the output signal out[1] as the high level and the low level when the first interim output signal up[1] and the second interim output signal dn[1] supplied from the first driving circuit D1-SR1 and the second driving circuit D2-SR1 are the low level.

Accordingly, the light emission control driver 40 to which the driver circuit is applied according to an exemplary embodiment of FIG. 6 concurrently outputs and transmits the light emission control signals of the high-level pulse to all pixels while maintaining the first drive control signal esr as a low level, and thereby the light emission of the pixels may be suppressed while the data signals are written. In this instance, when the transistors of the pixel 60 of the display device are PMOS transistors in an exemplary embodiment of the present invention, a circuit for generating high-level light emission control signals will be provided to suppress light emission, and without being restricted to this, other exemplary embodiments with different circuit designs depending on the types of the transistors of the pixels are applicable.

On the other hand, the light emission control driver 40 according to the exemplary embodiment of FIG. 6 sequentially outputs the light emission control signals with the controlled duty ratio according to the driving process of the driver of the present invention while the first control signal esr is maintained as the high level.

Differing from the light emission control driver 40 of FIG. 6, a light emission control driver for generating a light emission control signal applicable to the sequential light emitting mode and the simultaneous light emitting mode is shown in FIG. 7 is available as another exemplary embodiment.

FIG. 7 shows another configuration and operation of the buffer circuit B-SR1, and it can configure a shift register by combining with the first and second driving circuit according to the exemplary embodiment of FIG. 3A.

In FIG. 7, the buffer circuit B-SR1 further includes four transistors compared to the circuit diagram of FIG. 3A.

That is, a transistor B18 is added between the first power source voltage VGH and node N25 connected to a gate terminal of transistor B25.

In detail, transistor B18 includes a gate electrode connected to the first control signal terminal ESRt transmitted with the first control signal esr, a source electrode connected to the first power source voltage VGH, and a drain electrode connected to node N25.

Transistor B19 is added between the second power source voltage VGL1 and node N26 where gate electrodes of transistors B23 and B24 and a drain electrode of transistor B16 are commonly connected. In detail, transistor B19 includes a gate electrode connected to the first control signal terminal ESRt transmitted with the first control signal esr, a source electrode connected to the second power source voltage VGL1, and a drain electrode connected to node N26.

Transistor B20 is included between the first power source voltage VGH and node N26. In detail, transistor B20 includes a gate electrode connected to the second control signal terminal ESSt transmitted with the second control signal ess, a source electrode connected to the first power source voltage VGH, and a drain electrode connected to node N26.

Also, transistor B21 is added between the second power source voltage VGL1 and node N25. In detail, transistor B21 includes a gate electrode connected to the second control signal terminal ESSt transmitted with the second control signal ess, a source electrode connected to the second power source voltage VGL1, and a drain electrode connected to node N25.

As another exemplary embodiment, the source electrode of transistor B21 may be connected to the third power source voltage VGL2 less than the second power source voltage VGL1.

The gate electrodes of transistors B18 and B19 receive the first control signal esr, and the gate electrodes of transistors B20 and B21 receive the second control signal ess. According to the simultaneous or sequential light emitting mode of the display unit 10, the switching operation of transistors B18, B19, B20 and B21 is controlled by adjusting the first control signal esr and the second control signal ess. The detailed driving process will be described along with the timing diagram of FIG. 8.

Figure 8:
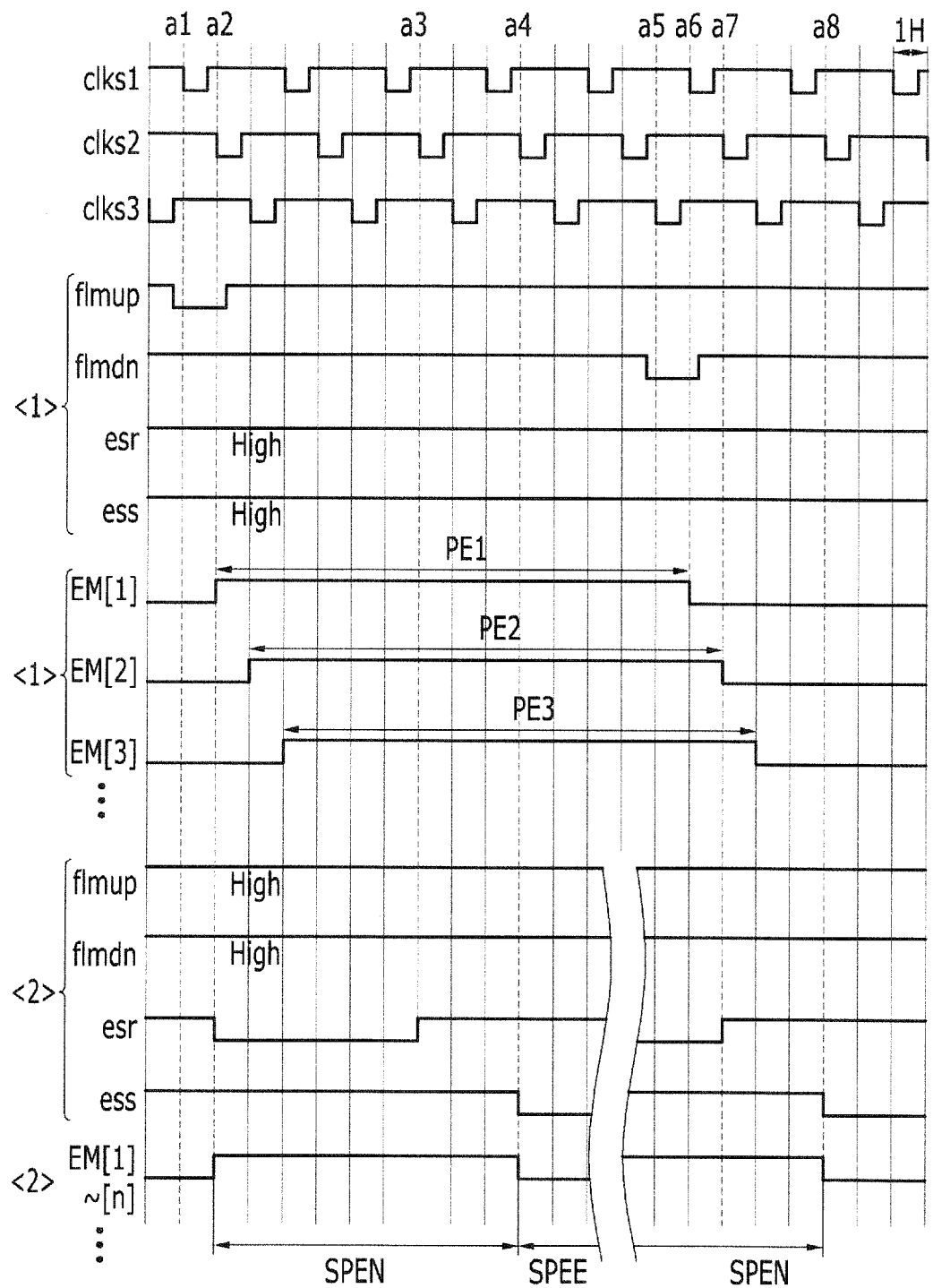
FIG. 8 is a timing diagram for driving a light emission control driver shown in FIG. 7 according to a sequential light emitting mode or a simultaneous light emitting mode of a display device.

FIG. 8 shows a driving timing diagram of the light emission control driver 40 to which a driving circuit of FIG. 7 is applied in the case of the sequential light emitting mode <1> and the case of the simultaneous light emitting mode <2>.

The output signal of the light emission control driver 40 output according to the signal timing of FIG. 8 means a light emission control signal that is a high-level pulse when the transistor for configuring the pixels of the display 10 is a PMOS transistor under the non-light-emitting, and that is a low-level pulse under the light emitting.

Therefore, in the case of the sequential light emitting mode <1>, the light emission control driver 40 sequentially generates light emission control signals with a phase difference by a predetermined period from the light emission control signal (EM[1]) transmitted to the first pixel line to the light emission control signal (EM[n]) transmitted to the last pixel line.

As already described with reference to the circuit shown in FIG. 3A, the first clock signal clks1 and the first start signal flmup are synchronized at time a1 to be transmitted to the light emission control driver and turn on transistor B2. At time a2 when the second clock signal clks2 becomes a low level, the first interim output signal up[1] becomes a low level to be input to the buffer circuit B-SR1, and the light emission control driver 40 outputs a high-state light emission control signal EM[1] to the first pixel line. The high level voltage of the light emission control signal EM[1] does not emit the pixels configured with the PMOS transistor such that the light emitting according to the data voltage applied to the pixels during the period PE1 is not executed.

After the predetermined time PE1 is passed, if the third clock signal clks3 and the second start signal flmdn are synchronized at the time a5 and transmitted as the low level, transistor B7 is turned on. Thus, the second interim output signal dn[1] becomes the low level at the time a6 that the first clock signal clks1 becomes the low level and is input to the buffer circuit B-SR1, and the light emission control driver 40 outputs the light emission control signal EM[1] transmitted to the first pixel line as the low state.

At the time a2, the first interim output signal up[1] generated in the first driving circuit of the shift register is transmitted to the first driving circuit of the shift register of the next second stage as the low pulse by the second clock signal clks2, and at the time a6, the second interim output signal dn[1] generated in the second driving circuit of the shift register is transmitted to the second driving circuit of the shift register of the next second stage as the low pulse by the first clock signal clks1, and thereby the light emission control signal is sequentially generated.

In this instance, the first control signal esr and the second control signal ess that are input to the buffer circuit included in the shift register of each stage are maintained at the high-level pulses, and transistors B18, B19, B20, and B21 that are related to the driving process are turned-off. Therefore, the duty ratio of the light emission control signal that is output by controlling the cycle or the pulse of the start signals or the clock signals are controlled in the sequential light emitting mode.

In the case of the non-sequential light emitting mode or the simultaneous light emitting mode <2>, the light emission control driver 40 generates the light emission control signals (EM[1]~[n]) and transmits the same to the pixel lines That is, the pixels of the display 10 having received the light emission control signals EM[1]~[n] are suppressed during the non-light-emitting period SPEN, and the pixels at once emit light to be displayed during the light emitting period SPEE.

The driving of the light emission control driver 40 of the present invention for outputting the light emission control signals EM[1]'[n] is controlled by the buffer circuit of the shift register.

That is, the first start signal flmup and the second start signal flmdn are maintained as the high state and the first driving circuit and the second driving circuit of the shift register are not operated. Therefore, the output light emission control signal is controlled by the first control signal esr and the second control signal ess.

That is, at time a1, when the first control signal esr is transited as the low level, transistor B18 and transistor B19 are turned on. The high-potential first power source voltage VGH is transmitted to transistor B25 by transistor B18 to be turned off, and the low-potential second power source voltage VGL1 is transmitted to transistors B23 and B24 by transistor B19 to be turned on.

Transistor B24 outputs the high-level voltage of the first power source voltage VGH as the voltage of the light emission control signals EM[1]~[n] that are applied to the pixel lines, and transistor B23 transmits the high-level voltage of the first power source voltage VGH to transistor B25 so that the circuit may be stably operable to generate the light emission control signals EM[1]~[n] although the leakage current of transistor B25 is high.

The light emission control signals EM[1]~[n] are maintained at the high state from time a1, and are changed to the low state when the first control signal esr is transited to the high level at time a3 and the second control signal ess is transited to the low state at time a4.

That is, at time a4, when the second control signal ess is transmitted as the low state to transistors B20 and B21, the same are turned on. When transistor B20 is turned on, the high-potential first power source voltage VGH turns off transistors B23 and B24.

By the turn-on of transistor B21, the low potential second power source voltage VGL1 or the third power source voltage VGL2 less than the second power source voltage VGL1 is transmitted to transistor B25 to output the entire light emission control signal EM[1]~[n] of the low potential level as the low state.

Therefore, the duty ratio of the light emission control signals EM[1]~[n] is controllable by controlling the cycle or the polarity state of the first control signal esr and the second control signal ess.

The period from time a2 to time a4 represents a non-light-emitting period SPEN since the entire light emission control signals EM[1]~[n] are output as the high state and all the pixels of the display 10 are in the non-light-emitting state.

At time a4, the light emission control signals EM[1]~[n] are transmitted as the low state and the pixels emit light, and the period for maintaining the low state becomes the light emitting period SPEE.

In the driving circuit, the circuit of the driving device including a transistor (a stabilization transistor) for allowing stable drive when the off current of the transistor connected to the output terminal is increased may be varied in various forms.

Also, the embodiment is applicable to various other forms including a circuit configuration for separating low-potential power supply so as to control the voltage applied to the gate electrode of the transistor that is connected to the output terminal to be less than the voltage that is applied to the source electrode, and thereby increase the operational margin of the transistor.

In general, the thin film transistor configuring the driving device increases the off current as time is passed, and the driving device including the thin film transistor with a high off current improves the operational margin to increase the yield of the display device including the driving device.

Figure 9:
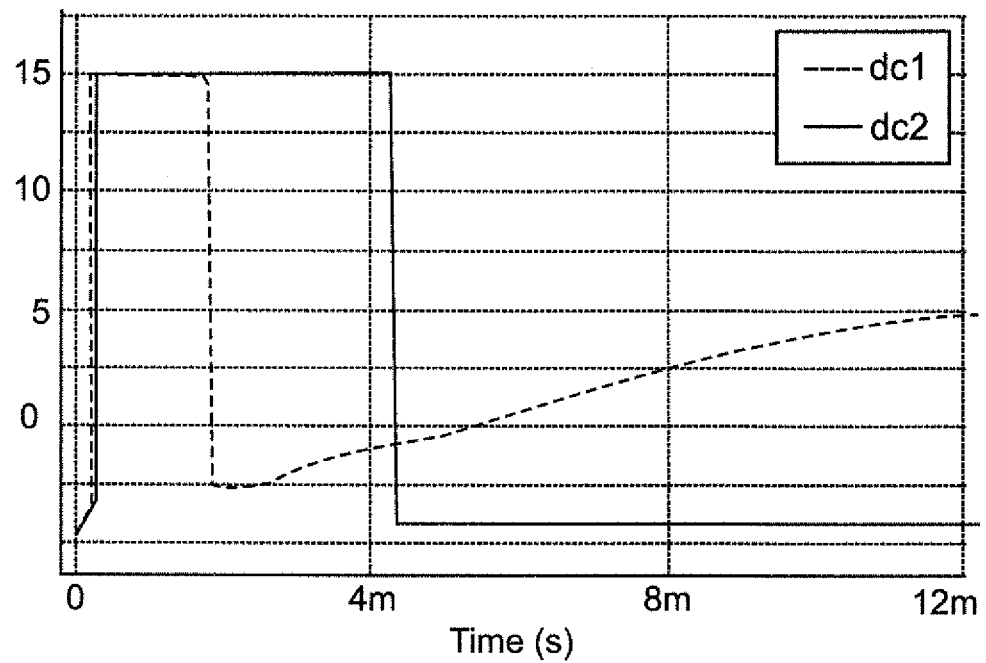
FIG. 9 shows a simulation graph for showing an improved process of a signal waveform generated by a driving device according to an exemplary embodiment of the present invention

FIG. 9 shows a simulation graph for showing an improved process of a signal waveform output by a driving device according to an exemplary embodiment of the present invention.

Referring to FIG. 9, when the constituent elements according to the embodiment of the present invention are added to the circuit of the driving device, the waveform of the driving signal is generated to be gradually more stable and reliable.

A dashed line dc1 shows an unstable waveform in which the driving signal that is output by the driver including the transistor with a high off current does not maintain the long high state and the low state.

However, when a stabilization transistor is added to the gate electrode of the transistor connected to the output terminal of the driving circuit, the high state of the signal that is output by the driving circuit is maintained for a desired period as shown by a solid line dc 2.

As described, this is because the stabilization transistor maintains the off state of the transistor that is connected to the output terminal in a more stable manner and so the high-level voltage is stably output through the output terminal.

Also, in the case that the power source voltage of the low potential is supplied to the driver of the present invention including the stabilization transistor, the low potential power source voltage applied to the gate electrode of the transistor connected to the output terminal of the driver is lower than the low potential power source voltage applied to the source electrode such that the voltage difference Vgs of the transistor connected to the output terminal may be stably maintained. Therefore, the output signal waveform of dc 2 is stably maintained at a high state for a long time and simultaneously the low level voltage is maintained in the low state.

Although the present invention is described with reference to the detailed exemplary embodiments of the present invention, this is by way of example only and the present invention is not limited thereto. A person of ordinary skill in the art may change or modify the described exemplary embodiments without departing from the scope of the present invention, and the changes or modifications are also included in the scope of the present invention. Further, materials of each components described in the present specification are easily selected from or replaced by various materials known to a person of ordinary skill in the art. In addition, a person of ordinary skill in the art may omit some of the components described in the present specification without deteriorating the performance or add components in order to improve the performance. Further, a person of ordinary skill in the art may change a sequence of processes described in the present specification according to the process environments or equipment. Therefore, the scope of the present invention should be defined by the appended claims and equivalents, not by the described exemplary embodiments.

What is claimed is:

1. A driver comprising:
    a first driving circuit receiving a first input signal and three phase clock signals and generating a first output signal controlled according to a first clock signal among the three phase clock signals;
    a second driving circuit receiving a second input signal and the three phase clock signals and generating a second output signal controlled according to a second clock signal among the three phase clock signals; and
    at least one buffer circuit generating a third output signal of a voltage level corresponding to a gate-on voltage level of the first output signal or the second output signal when the first output signal or the second output signal is transmitted as the gate-on voltage level,
    wherein the buffer circuit includes:
        a first transistor transmitting a voltage of a first level as the third output signal, and
        a second transistor transmitting a voltage of a second level turning off the first transistor and connected to a gate electrode of the first transistor; and
        a third transistor connected to the gate electrode of the first transistor and transmitting a voltage of a third level less than the voltage of the first level turning on the first transistor.

2. The driver of claim 1, wherein the voltage of the third level is less than the first level by at least two times of a threshold voltage of the first transistor.

3. The driver of claim 1, wherein the voltage of the first level is a low level voltage applied from a power source voltage of a low potential.

4. The driver of claim 1, wherein the buffer circuit further includes a fourth transistor connected to an output terminal outputting the third output signal and transmitting the voltage of the second level as the third output signal.

5. The driver of claim 4, wherein the voltage of the second level is a high level voltage applied from a power source voltage of a high potential.

6. The driver of claim 1, wherein the third output signal is output as a voltage of an inverted level when the first output signal is the gate-on voltage level, and is output as a voltage of a corresponding level when the second output signal is the gate-on voltage level.

7. The driver of claim 6, wherein the gate-on voltage level is a low level.

8. The driver of claim 1, wherein the third output signal is output as the voltage of the second level when the first output signal is transmitted as the gate-on voltage level to the buffer circuit, and is output as the voltage of the first level when the second output signal is transmitted as the gate-on voltage level to the buffer circuit.

9. The driver of claim 1, wherein the third output signal is controlled according to a pulse width or a cycle of the first clock signal controlling the output voltage level of the first output signal in the first driving circuit and the second clock signal controlling the output voltage level of the second output signal in the second driving circuit.

10. The driver of claim 1, wherein a time that the voltage level of the third output signal is determined is in synchronization with a time that the first output signal is generated corresponding to a gate-on voltage level pulse of the first clock signal controlling the output voltage level of the first output signal when the first input signal input in the first driving circuit is transmitted as the gate-on voltage level, or is in synchronization with a time that the second output signal is generated corresponding to a gate-on voltage level pulse of the second clock signal controlling the output voltage level of the second output signal when the second input signal input in the second driving circuit is transmitted as the gate-on voltage level.

11. The driver of claim 1, wherein the three phase clock signals having a mutual phase difference of ⅓ cycle.

12. The driver of claim 1, wherein the first driving circuit includes:
    a first switch controlled by the first clock signal transmitted through a first clock signal terminal and transmitting a voltage according to a voltage level of the first input signal, transmitted through an input signal terminal, to a first node;
    a second switch controlled by the first input signal and transmitting a voltage according to a voltage level of a first power source voltage to a second node;
    a third switch controlled by the voltage transmitted to the first node and transmitting a voltage according to a voltage level of the second clock signal transmitted through a second clock signal terminal as the voltage level of the first output signal;
    a fourth switch controlled by the voltage transmitted to the second node and transmitting the first power source voltage as the voltage level of the first output signal;
    a first capacitor keeping the voltage transmitted to the first node; and
    a second capacitor keeping the voltage transmitted to the second node.

13. The driver of claim 12, wherein the first driving circuit further includes:
    at least one fifth switch controlled by a second power source voltage lower than the first power source voltage and transmitting the first power source voltage to the first node; and a sixth switch controlled by the third clock signal input through a third clock signal terminal and transmitting the second power source voltage to the fifth switch.

14. The driver of claim 1, wherein the second driving circuit further includes:
a seventh switch controlled by the third clock signal transmitted through a third clock signal terminal and transmitting a voltage according to a voltage level of the second input signal, transmitted through an input signal terminal, to a third node;
an eighth switch controlled by the second input signal and transmitting a voltage according to a voltage level of a first power source voltage to a fourth node;
a ninth switch controlled by the voltage transmitted to the third node and transmitting a voltage according to a voltage level of the first clock signal transmitted through a first clock signal terminal as the voltage level of the second output signal;
a tenth switch controlled by the voltage transmitted to the fourth node and transmitting the first power source voltage as the voltage level of the second output signal;
a third capacitor keeping the voltage transmitted to the third node; and
a fourth capacitor keeping the voltage transmitted to the fourth node.

15. The driver of claim 14, wherein the second driving circuit further includes:
at least one eleventh switch controlled by a second power source voltage lower than the first power source voltage and transmitting the first power source voltage to the third node; and
a twelfth switch controlled by the second clock signal input through a second clock signal terminal and transmitting the second power source voltage to the eleventh switch.

16. The driver of claim 1, wherein the buffer circuit further includes:
a thirteenth switch controlled by the first output signal and transmitting the voltage of the second level to the first transistor;
a fourteenth switch controlled by the first output signal and transmitting the voltage of the first level to the second transistor and a fifteenth switch;
the fifteenth switch controlled by the transmitted voltage of the first level and transmitting the voltage of the second level as the third output signal;
a sixteenth switch controlled by the second output signal and transmitting the voltage of the third level less than the voltage of the first level to the first transistor and a seventeenth switch;
the seventeenth switch controlled by the voltage of the third level and transmitting the voltage of the second level to the fifteenth switch;
a fifth capacitor keeping the voltage transmitted to the gate electrode of the first transistor; and
a sixth capacitor keeping the voltage transmitted to a gate electrode of the fifteenth switch, and
the first transistor is operated in response to the voltage of the second level or the third level and outputs the voltage of the first level as the third output signal.

17. The driver of claim 16, wherein the voltage of the third level is transmitted to the first transistor and the seventeenth switch through the third transistor.

18. The driver of claim 1, wherein the first output signal is transmitted as a first input signal of a first driving circuit of a next stage.

19. The driver of claim 1, wherein the second output signal is transmitted as a second input signal of a second driving circuit of a next stage.

20. The driver of claim 1, wherein the buffer circuit further includes a first driving switch transmitting the voltage of the second level to the gate electrode of the first transistor when being turned on in response to a first control signal; and
a second driving switch transmitting the voltage of the first level to the gate electrode of the second transistor when being turned on in response to the first control signal.

21. The driver of claim 20, wherein the first driving switch and the second driving switch are turned on, and the buffer circuit generates the voltage of the second level as the third output signal during the period in which the first control signal is transmitted as the gate-on voltage level.

22. The driver of claim 1, wherein the buffer circuit further includes:
a first driving switch transmitting the voltage of the second level to the gate electrode of the first transistor when being turned on in response to a first control signal;
a second driving switch transmitting the voltage of the first level to the gate electrode of the second transistor when being turned on in response to the first control signal;
a third driving switch transmitting the voltage of the second level to the gate electrode of the second transistor when being turned on in response to a second control signal; and
a fourth driving switch transmitting the voltage of the first level or the voltage of the third level less than the voltage of the first level to the gate electrode of the first transistor when being turned on in response to the second control signal.

23. The driver of claim 22, wherein, while the first driving circuit and the second driving circuit of the driver are turned off, if the first control signal is applied as the gate-on voltage level, the first driving switch and the second driving switch are turned on such that the buffer circuit generates the voltage of the second level as the third output signal, and if the second control signal is applied as the gate-on voltage level, the third driving switch and the fourth driving switch are turned on such that the buffer circuit generates the voltage of the first level or the voltage of the third level as the third output signal.

24. The driver of claim 1, wherein the first driving circuit, the second driving circuit, and the buffer circuit each comprise a plurality of transistors, and the plurality of transistors are realized by PMOS transistors or NMOS transistors.

25. A display device comprising:
a display unit including a plurality of pixels connected to a plurality of scan lines transmitting a plurality of scan signals, a plurality of data lines transmitting a plurality of data signals, and a plurality of light emission control lines transmitting a plurality of light emission control signals;
a scan driver transmitting a scan signal to a corresponding scan line of the plurality of scan lines;
a data driver transmitting a data signal to a corresponding data line of the plurality of data lines; and
a light emission control driver transmitting a light emission control signal to a corresponding light emission control line of the plurality of light emission control lines;
wherein the scan driver or the light emission control driver includes a first driving circuit receiving a first input signal and three phase clock signals and generating a first output signal controlled according to a first clock signal among the three phase clock signals, a second driving circuit receiving a second input signal and the three phase clock signals and generating a second output signal controlled according to a second clock signal among the three phase clock signals, and at least one buffer circuit generating a third output signal of a voltage level corresponding to a gate-on voltage level of the first output signal or the second output signal when the first output signal or the second output signal is transmitted as the gate-on voltage level, and the buffer circuit includes a first transistor transmitting a voltage of a first level as the third output signal, a second transistor transmitting a voltage of a second level turning off the first transistor and connected to a gate electrode of the first transistor, and a third transistor connected to the gate electrode of the first transistor and transmitting a voltage of a third level less than the voltage of the first level turning on the first transistor.

26. The display device of claim 25, wherein the voltage of the third level is less than the first level by at least two times a threshold voltage of the first transistor.

27. The display device of claim 25, wherein the voltage of the first level is a low level voltage applied from a power source voltage of a low potential.

28. The display device of claim 25, wherein the buffer circuit further includes a fourth transistor connected to an output terminal outputting the third output signal and transmitting the voltage of the second level as the third output signal.

29. The display device of claim 28, wherein the voltage of the second level is a high level voltage applied from a power source voltage of a high potential.

30. The display device of claim 25, wherein the third output signal is output as a voltage of an inverted level when the first output signal is the gate-on voltage level, and is output as a voltage of a corresponding level when the second output signal is the gate-on voltage level.

31. The display device of claim 30, wherein the gate-on voltage level is a low level.

32. The display device of claim 25, wherein the third output signal is output as the voltage of the second level when the first output signal is transmitted as the gate-on voltage level to the buffer circuit, and is output as the voltage of the first level when the second output signal is transmitted as the gate-on voltage level to the buffer circuit.

33. The display device of claim 25, wherein the third output signal is controlled according to a pulse width or a cycle of the first clock signal controlling the output voltage level of the first output signal in the first driving circuit and the second clock signal controlling the output voltage level of the second output signal in the second driving circuit.

34. The display device of claim 25, wherein a time that the voltage level of the third output signal is generated and determined is in synchronization with a time that the first output signal is generated corresponding to a gate-on voltage level pulse of the first clock signal controlling the output voltage level of the first output signal when the first input signal input in the first driving circuit is transmitted as the gate-on voltage level, or is in synchronization with a time that the second output signal is generated corresponding to a gate-on voltage level pulse of the second clock signal controlling the output voltage level of the second output signal when the second input signal input in the second driving circuit is transmitted as the gate-on voltage level.

35. The display device of claim 25, wherein the three phase clock signals having a mutual phase difference of ⅓ cycle.

36. The display device of claim 25, wherein the first output signal is transmitted as a first input signal of a first driving circuit of a next stage.

37. The display device of claim 25, wherein the second output signal is transmitted as a second input signal of a second driving circuit of a next stage.

38. The display device of claim 25, wherein the buffer circuit further includes:
a first driving switch transmitting the voltage of the second level to the gate electrode of the first transistor when being turned on in response to a first control signal; and
a second driving switch transmitting the voltage of the first level to a gate electrode of the second transistor when being turned on in response to the first control signal.

39. The display device of claim 38, wherein the first driving switch and the second driving switch are turned on, and the buffer circuit generates the voltage of the second level as the third output signal during a period in which the first control signal is transmitted as the gate-on voltage level.

40. The display device of claim 25, wherein the buffer circuit further includes:
a first driving switch transmitting the voltage of the second level to the gate electrode of the first transistor when being turned on in response to a first control signal;
a second driving switch transmitting the voltage of the first level to a gate electrode of the second transistor when being turned on in response to the first control signal;
a third driving switch transmitting the voltage of the second level to the gate electrode of the second transistor when being turned on in response to a second control signal; and
a fourth driving switch transmitting the voltage of the first level or the voltage of the third level less than the voltage of the first level to the gate electrode of the first transistor when being turned on in response to the second control signal.

41. The display device of claim 40, wherein, while the first driving circuit and the second driving circuit of the scan driver or the light emission control driver of the display device are turned off,
if the first control signal is applied as the gate-on voltage level, the first driving switch and the second driving switch are turned on such that the buffer circuit generates the voltage of the second level as the third output signal, and
if the second control signal is applied as the gate-on voltage level, the third driving switch and the fourth driving switch are turned on such that the buffer circuit generates the voltage of the first level or the voltage of the third level as the third output signal.

42. The display device of claim 40, wherein, when the display unit of the display device is in a simultaneous light emitting mode, the first driving circuit and the second driving circuit of the light emission control driver are turned off,
if the first control signal is applied as the gate-on voltage level, a plurality of light emission control signals are generated as the gate-off voltage level such that a non-light-emitting period is started, and
if the second control signal is applied as the gate-on voltage level, a plurality of light emission control signals are generated as the gate-on voltage level such that a light emitting period is started.

43. The display device of claim 25, wherein the first driving circuit, the second driving circuit, and the buffer circuit each comprise a plurality of transistors, and the plurality of transistors are realized by PMOS transistors or NMOS transistors.

* * * * *